(12) United States Patent
Röhrer et al.

(10) Patent No.: US 8,399,937 B2
(45) Date of Patent: Mar. 19, 2013

(54) SEMICONDUCTOR BODY AND METHOD FOR THE DESIGN OF A SEMICONDUCTOR BODY WITH A CONNECTING LINE

(75) Inventors: Georg Röhrer, Graz (AT); Martin Knaipp, Unterpremstätten (AT)

(73) Assignee: austriamicrosystems AG, Unterpremstatten (AT)

( * ) Notice: Subject to any disclaimer, the term of this patent is extended or adjusted under 35 U.S.C. 154(b) by 662 days.

(21) Appl. No.: 12/447,185

(22) PCT Filed: Oct. 24, 2007

(86) PCT No.: PCT/EP2007/061420

§ 371 (c)(1),
(2), (4) Date: Jan. 4, 2010

(87) PCT Pub. No.: WO2008/049861

PCT Pub. Date: May 2, 2008

(65) Prior Publication Data

US 2010/0117162 A1    May 13, 2010

(30) Foreign Application Priority Data

Oct. 24, 2006   (DE) .................... 10 2006 050 087

(51) Int. Cl.
*H01L 23/48* (2006.01)
(52) U.S. Cl. ............ 257/401; 257/775; 257/E23.151
(58) Field of Classification Search ............ 257/401, 257/774, 775, E23.01, E23.151
See application file for complete search history.

(56) References Cited

U.S. PATENT DOCUMENTS

| 3,737,743 | A | | 6/1973 | Goronkin et al. | |
|---|---|---|---|---|---|
| H0000842 | H | * | 11/1990 | Ochs | 257/767 |
| 5,258,638 | A | | 11/1993 | Elhatem et al. | |
| 5,633,525 | A | | 5/1997 | Kitamura et al. | |
| 5,649,170 | A | | 7/1997 | Chappell et al. | |
| 5,672,894 | A | * | 9/1997 | Maeda et al. | 257/343 |
| 5,981,983 | A | | 11/1999 | Funaki et al. | |
| 6,407,905 | B1 | | 6/2002 | Connolly et al. | 361/303 |
| 6,767,779 | B2 | | 7/2004 | Tanghe et al. | |
| 7,245,516 | B2 | * | 7/2007 | Inoue | 365/51 |
| 2005/0139891 | A1 | | 6/2005 | Beach et al. | |
| 2006/0289994 | A1 | * | 12/2006 | Greenberg et al. | 257/758 |

FOREIGN PATENT DOCUMENTS

| GB | 1109371 | 4/1968 |
|---|---|---|
| JP | 61 075565 | 4/1986 |
| JP | 08-125176 | 5/1996 |
| JP | 08-255910 | 10/1996 |
| JP | 2002-164437 | 6/2002 |
| JP | 2006-278677 | 10/2006 |
| WO | WO 00/30179 | 5/2000 |

(Continued)

OTHER PUBLICATIONS

M. Darwish et al., "Scaling Issues in Lateral Power MOSFETs", Proceedings of 1998 International Symposium on Power Semiconductor Devices & ICs, pp. 329-332, Kyoto, Japan.

(Continued)

*Primary Examiner* — Wensing Kuo
(74) *Attorney, Agent, or Firm* — Cozen O'Connor

(57) ABSTRACT

A semiconductor body (1) comprises a connecting lead (21) for contacting a semiconductor area (2). The conductivity S per unit length of the connecting lead (21) changes from a first value SW to a second value S0. The semiconductor area (2) is electrically conductively connected to the connecting lead (21).

20 Claims, 15 Drawing Sheets

FOREIGN PATENT DOCUMENTS

| | | |
|---|---|---|
| WO | WO 01/52314 | 7/2001 |
| WO | WO 2005/059957 | 6/2005 |
| WO | WO 2005/062998 | 7/2005 |

OTHER PUBLICATIONS

M. Kataoka et al., Analysis of Al-shorted Wsix/Si Gate Performance in High-Frequency Band Si Power MOSFETs with Process/Device/Circuit Continuous Simulation, Proceedings of 1998 International Symposium on Power Semiconductor Devices & ICs, pp. 333-336, Kyoto, Japan.

F. Maloberti, "Layout of Analog CMOS IC-Waffle Transistor", http://ims.unipv.it, p. 23, Jul. 2006.

\* cited by examiner

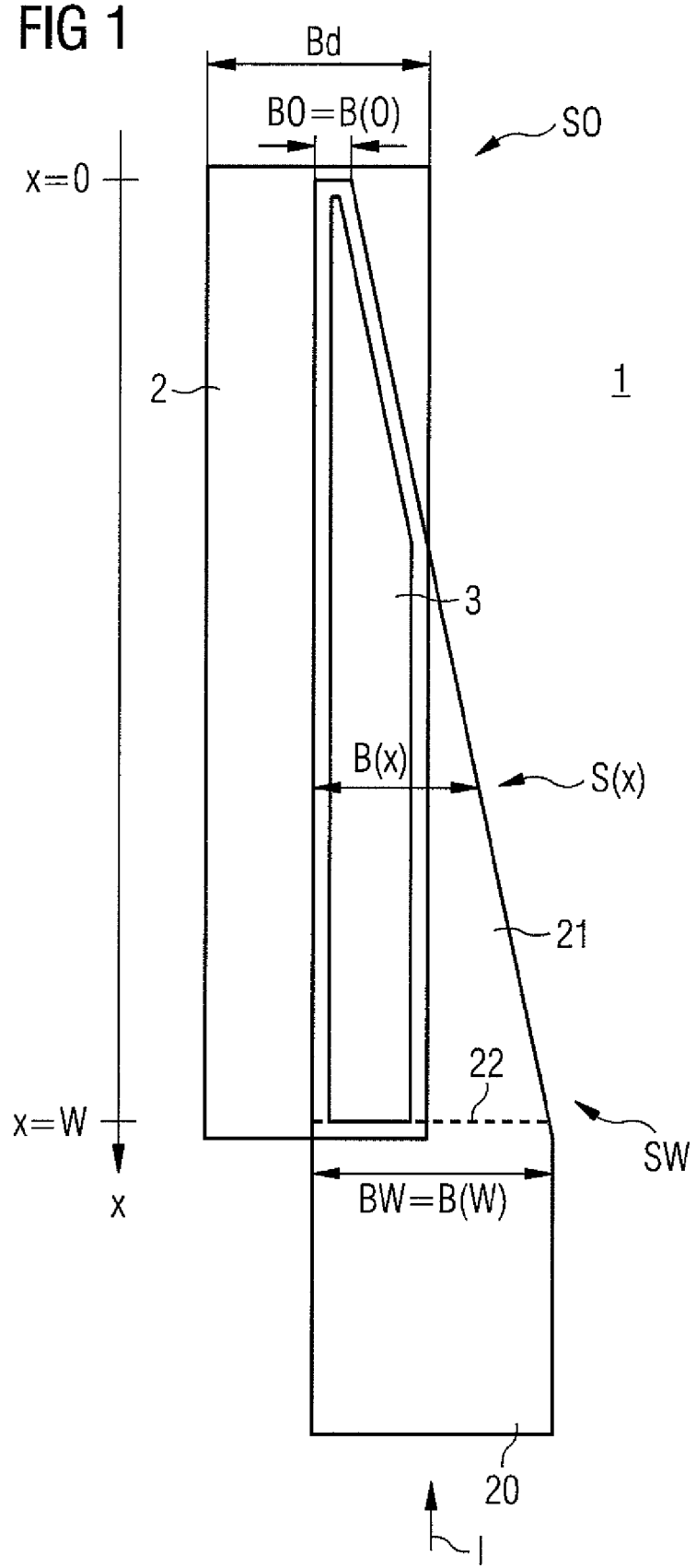

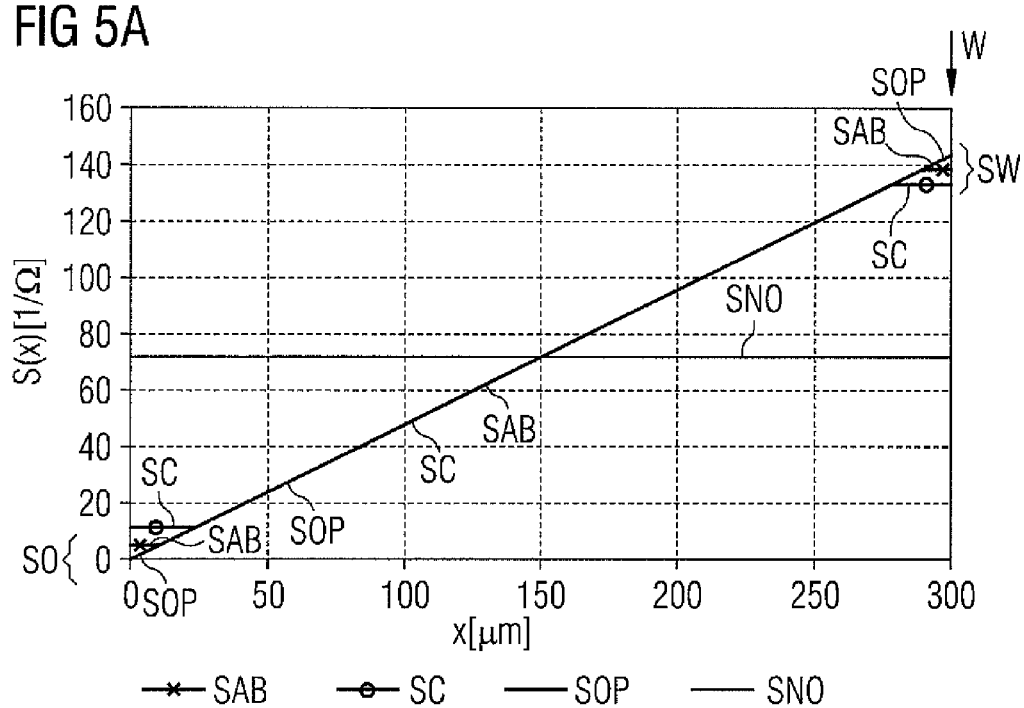
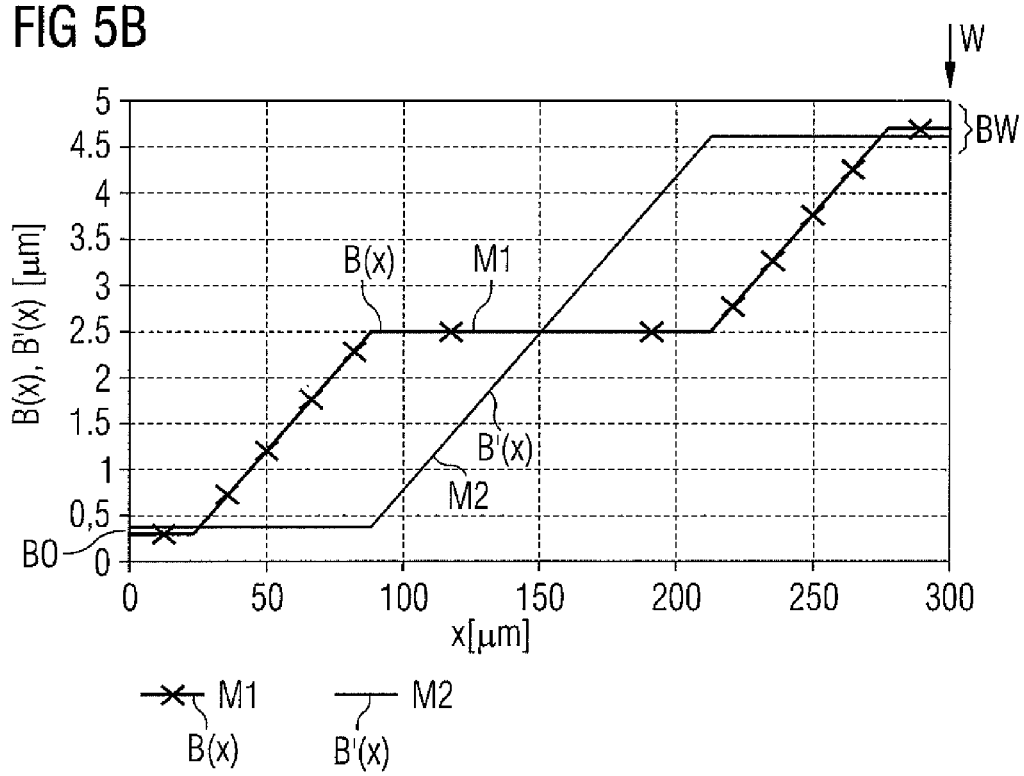

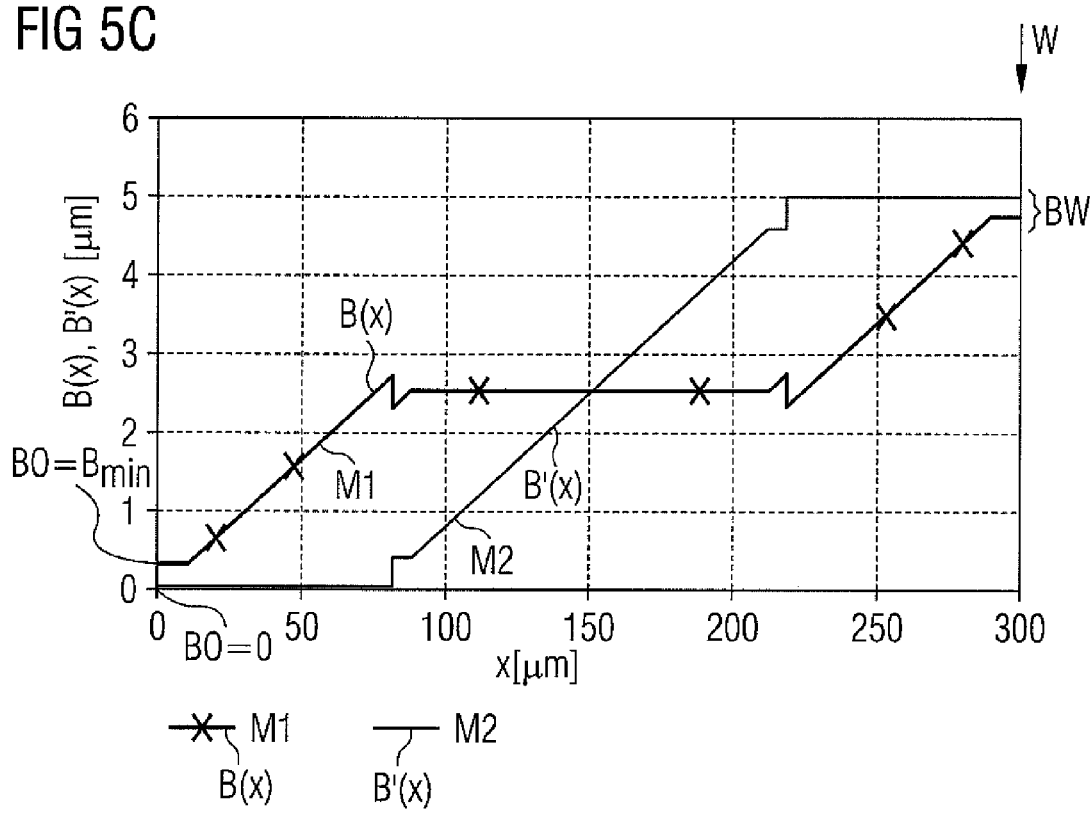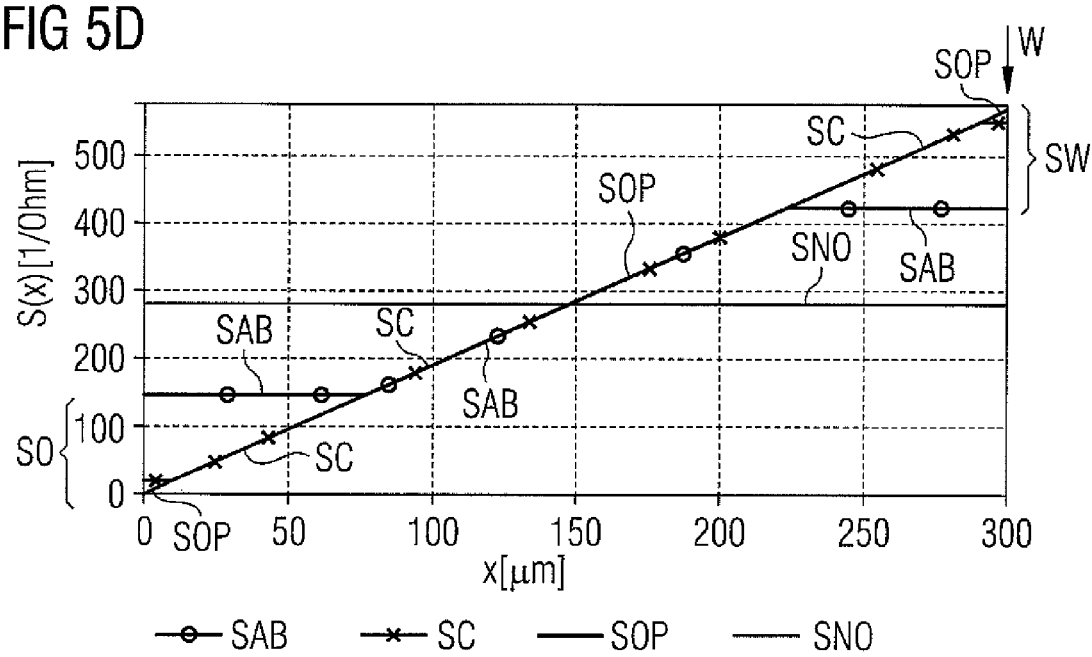

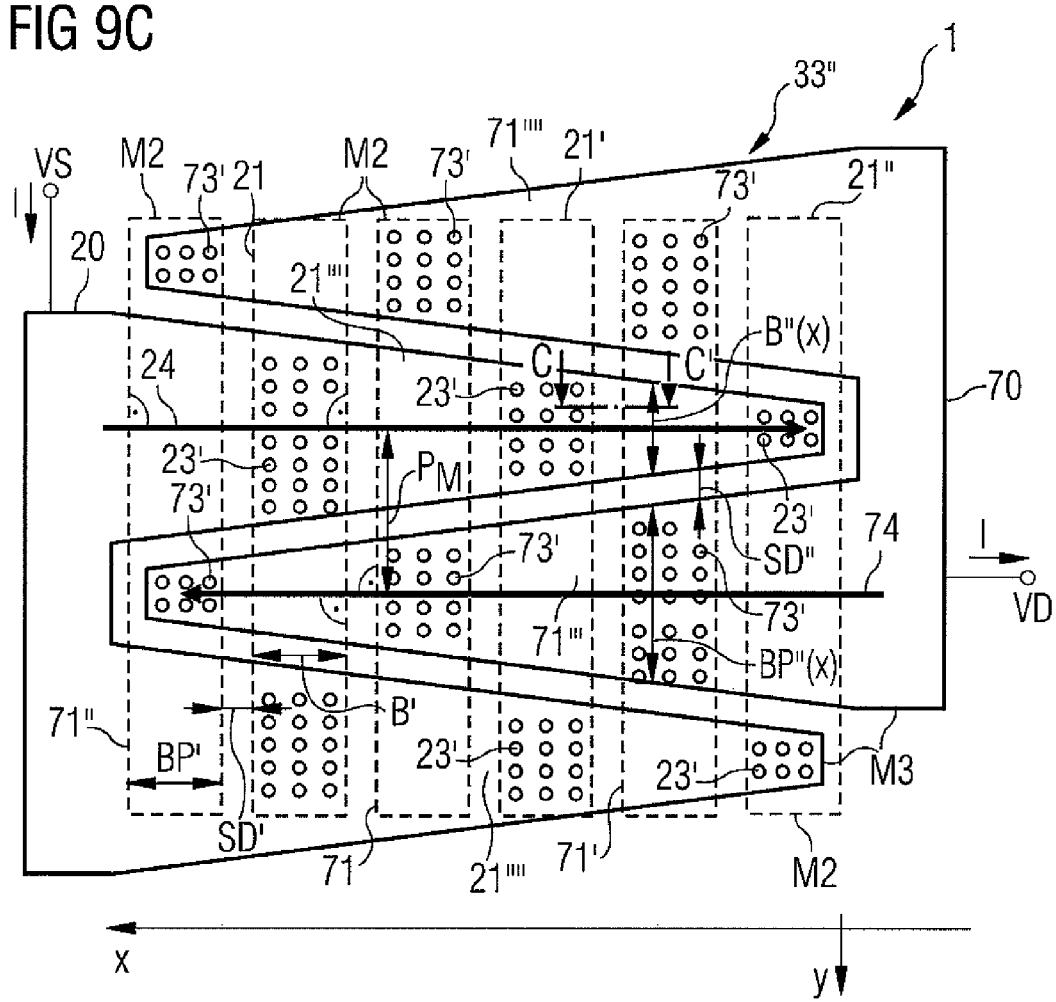

SEMICONDUCTOR BODY AND METHOD FOR THE DESIGN OF A SEMICONDUCTOR BODY WITH A CONNECTING LINE

RELATED APPLICATIONS

This is a U.S. national stage under 35 USC §371 of application No. PCT/EP2007/061420, filed on Oct. 24, 2007.

This application claims the priority of German Patent Application No. 10 2006 050 087.3 filed Oct. 24, 2006, the entire content of which is hereby incorporated by reference.

FIELD OF THE INVENTION

The present invention relates to a semiconductor body with a connecting lead, a transistor comprising the semiconductor body with the connecting lead, a diode comprising the semiconductor body with the connecting lead, a method for designing a semiconductor body with a connecting lead, and a computer program product.

BACKGROUND OF THE INVENTION

A semiconductor area of a semiconductor body is often contacted by means of a connecting lead that is rectangular in a plan view of the semiconductor body. For this purpose, a rectangular strip conductor made from metal is provided that features direct contact with the semiconductor area through an opening in an insulation layer and therefore establishes an ohmic contact or a Schottky contact with the semiconductor area.

The document by M. Darwish et al., "Scaling Issues in Lateral Power MOSFETs," Proceedings of 1998 International Symposium on Power Semiconductor Devices and ICs, Kyoto, Japan, pp. 329-332, shows two layouts of field-effect transistors in FIG. 3 in which the source connecting leads and the drain connecting leads have a rectangular construction. In one type, the source connecting lead and the drain connecting lead are contacted on the same side of the transistor. In another type, the source connecting lead and the drain connecting lead are contacted on opposite sides of the transistor.

The document WO 2005/062998 A2 relates to a semiconductor body with a solderable metallization system.

SUMMARY OF THE INVENTION

One object of the present invention is to provide a semiconductor body with a connecting lead, a transistor, a diode, a method for designing a semiconductor body with a connecting lead, and also a computer program product allowing a uniform current flow from the connecting lead into the semiconductor area.

According to an aspect of the invention, a semiconductor body comprises a connecting lead. The connecting lead is formed such that the conductivity per unit length changes from a first value to a second value along the length of the connecting lead. The connecting lead is provided in order to establish electrical contact with a semiconductor area of the semiconductor body.

Current can flow through such a connecting lead into, for example, a semiconductor area. The connecting lead has a cross-sectional area through which the current in the connecting lead flows. At this cross-sectional area, the conductivity per unit length of the connecting lead has the first value. Because a semiconductor area is in electrical contact with the connecting lead, a first part of the current continues to flow through the connecting lead and a second part of the current flows into the semiconductor area due to the conductive contact. The farther the location of the cross-sectional area through which the connecting lead supplied with current is moved in the direction of the end of the connecting lead, the smaller the current that flows through a cross section of the connecting lead. Due to the resistance per unit length of the connecting lead, the current flow causes a voltage drop along the connecting lead.

The conductivity per unit length of the connecting lead is advantageously large in the vicinity of the cross-sectional area through which the connecting lead is supplied with electrical current, so that the voltage drop is kept small there.

Advantageously, the voltage along the connecting lead and the current density of the current flowing from the connecting lead into the semiconductor area are set by the position-dependent setting of the conductivity per unit length of the connecting lead along the length of the connecting lead. The conductivity per unit length can also be designated as conductance per unit length.

Preferably, the conductivity per unit length decreases from the first value to the second value along the length of the connecting lead. Here, the conductivity per unit length advantageously has the first value at the cross-sectional area through which the current flows into the connecting lead.

In one embodiment, the semiconductor body features the semiconductor area that is contacted electrically by means of the connecting lead. In one embodiment, the semiconductor area can be covered with an insulator layer that has an opening as a contact hole at which the connecting lead is in direct contact with the semiconductor area. For high dopant concentrations at the surface of the semiconductor area, the contact between the connecting lead and the semiconductor area can exhibit an ohmic behavior and a Schottky behavior for a lower dopant concentration.

For connecting the connecting lead to the semiconductor area, a large area contact hole can be provided. Alternatively, a number of small contact holes can be provided for connecting the connecting lead to the semiconductor area.

The connecting lead can feature a length W between the cross-sectional area through which the current flows into the connecting lead and the end of the connecting lead.

In one embodiment, the conductivity of the connecting lead per unit length changes approximately linearly from the first value to the second value along the length of the connecting lead. Preferably, the conductivity per unit length of the connecting lead decreases approximately linearly from the first value to the second value along the length of the connecting lead. Advantageously, it can be achieved that, for example, at a constant value for the current that flows per unit length from the connecting lead into the semiconductor area, the profile of the voltage runs approximately linearly along the length of the connecting lead.

In one embodiment, the connecting lead has a width. The width of the connecting lead has a first value close to the area through which the connecting lead is supplied with current and has a second value at the end of the connecting lead. The width changes from the first value to the second value. In a top view onto the semiconductor body, the connecting lead thus has a length W and a variable width that changes along the length W. The conductivity per unit length is a product of the width, a thickness, and a specific conductivity of the connecting lead.

The width preferably decreases from the first value to the second value. Because the conductivity per unit length is proportional to the width of the connecting lead, if the thickness and the specific conductivity of the connecting lead are constant, the conductivity also decreases from the first value to the second value.

The width can change linearly from the first value to the second value along the length of the connecting lead. The width can preferably decrease linearly from the first value to the second value. Advantageously, it can be achieved that, for example, at a constant value for the current that flows per unit length from the connecting lead into the semiconductor area, the current density in the connecting lead is constant and the profile of the voltage along the length of the connecting lead is approximately linear. Alternatively, the width can decrease in one discrete step or several discrete steps from the first value to the second value.

In one embodiment, for the second value of the width of the connecting lead, the value of a minimum, specified strip conductor width is provided. Such a minimum, specified strip conductor width can be specified in the design rules.

In one embodiment, the connecting lead has a conductive layer that is connected to the semiconductor area by means of one or more contact holes. The conductive layer can also be called strip conductor layer or metal layer.

In an alternative embodiment, the connecting lead has a first number N of conductive layers. The conductive layers are connected to each other in an electrically conductive way by means of vertical vias one under the other. The conductive layer that is arranged closest to the semiconductor area is connected in an electrically conductive way to the semiconductor area by means of the one or more vias. Advantageously, by means of a parallel circuit of conductive layers, the conductivity of the connecting lead can be increased, so that a voltage drop on the connecting lead between the two ends of the connecting lead can be kept small. Preferably, the first number N can be at least two.

The conductive layer can comprise, as a material, polycrystalline silicon. The polycrystalline silicon can be doped. Alternatively, the conductive layer can comprise a silicide. Preferably, the conductive layer can comprise a metal. The metal can be a transition metal, such as titanium, tantalum, molybdenum, tungsten, or platinum. The metal can be aluminum. A conductive layer can also comprise, in addition to the aluminum, a copper portion and/or a silicon portion. Preferably, the metal can be copper.

If the first number N of conductive layers is greater than 1, then the different conductive layers can comprise the same material. Preferably, the different conductive layers can comprise different materials. Preferably, polycrystalline silicon and silicides can be arranged adjacent to the semiconductor area as well as metals at a distance to the semiconductor area.

In one embodiment, the first number N of conductive layers have the same width that decreases from a first value to a second value along each layer. In one refinement of the embodiment, the width of the first number N of conductive layers decreases linearly from the same first value to the same second value.

In one embodiment, a first conductive layer has a width that differs from a width of a second conductive layer. The conductivity of the connecting lead results from the sum of the conductivities of the different conductive layers. A linear decrease of the conductivity per unit length of the connecting lead can be achieved with several conductive layers even if their widths are different. In this way, higher flexibility is advantageously possible in the design.

In one embodiment, the conductive layer arranged closest to the semiconductor area has a second value at the end of the connecting lead, where this value is not equal to 0. At least the conductive layer that is arranged at the greatest distance to the semiconductor area can have a second value that equals 0 at the end of the connecting lead.

In one alternative embodiment, the width of one of the first number N of conductive layers can decrease in a first section along the length of the connection line, while the width of another of the first number N of conductive layers can be constant.

In an alternative embodiment, the width of one of the first number N of conductive layers decreases in a first section along the length of the connecting lead, while the width of the other conductive layers is constant. In another section of the connecting lead, the width of one of the first number of conductive layers can be constant, while the width of another of the first number of conductive layers decreases. By selecting which of the conductive layers decreases in a section of the connecting lead and which of the other layers has a constant width in this length section, the conductivity per unit length of the connecting lead can be set advantageously quite flexibly.

In one refinement, the width of one of the first number N of conductive layers can exhibit a first function depending on a location along the length of the connecting lead and the width of another of the first number N of conductive layers can exhibit a second function depending on a location along the length of the connecting lead. Here, the first function can differ from the second function.

In one refinement, the semiconductor body has an inverse-parallel connecting lead in which current flows in the opposite direction to that flowing in the connecting lead. The inverse-parallel connecting lead is provided for contacting another semiconductor area. The additional semiconductor area and the semiconductor area can be arranged approximately parallel. The inverse-parallel connecting lead can be arranged approximately parallel to the connecting lead. The inverse-parallel connecting lead can feature the length W. A conductivity per unit length of the inverse-parallel connecting lead can increase from a first value that occurs at the end of the inverse-parallel connecting lead to a second value that occurs in the vicinity of the cross-sectional area through which the inverse-parallel connecting lead is supplied with current.

In one embodiment, the inverse-parallel connecting lead has a width that increases from a first value to a second value and the connecting lead has a width that decreases from the first value to the second value. In a preferred embodiment, the sum from the width of the connecting lead and the width of the inverse-parallel connecting lead is approximately constant.

In one embodiment, a constant spacing can be provided from the inverse-parallel connecting lead to the connecting lead. If the width of the connecting lead decreases linearly and the width of the inverse-parallel connecting lead increases linearly, then advantageously a shape comprising the connecting lead, the inverse-parallel connecting lead, and the spacing between the two connecting leads can be rectangular.

In one embodiment, a first number N of conductive layers can have a first thickness and another of the first number N of conductive layers can have another thickness. The first and the additional thickness can have the same value.

Alternatively, the additional thickness can have a value greater than the first thickness. Preferably, the distance of the inverse-parallel connecting lead to the connecting lead of the other of the conductive layers with the other thickness can be greater than the distance of the inverse-parallel connecting lead to the connecting lead of the first of the conductive layers with the first thickness.

In one embodiment according to the invention, a transistor can comprise the semiconductor area, the additional semiconductor area, the connecting lead, and the inverse-parallel connecting lead. The transistor can be realized as a bipolar transistor. Alternatively, the transistor can be realized as a field-effect transistor, the semiconductor area as a source area, and the additional semiconductor area as a drain area. The transistor can also have a gate insulator and a gate electrode.

In one embodiment, the transistor comprises a first plural number N1 of connecting leads and a second plural number N2 of inverse-parallel connecting leads. Here, the transistor can comprise a third number N3 of the semiconductor areas and a fourth number N4 of the additional semiconductor areas. The third number N3 is at least 1. The fourth number N4 is likewise at least 1. The first plural number N1 can have the same value as the third number N3. Likewise, the second plural number N2 can have the same value as the fourth number N4. The semiconductor areas are contacted in an electrically conductive way by the connecting leads and the additional semiconductor areas are connected by the inverse-parallel connecting leads. The connecting leads and the inverse-parallel connecting leads each comprise the first number N of conductive layers. The first number N can preferably have at least the value 2.

In one embodiment, the several conductive layers of the connecting leads and the several conductive layers of the inverse-parallel connecting leads feature main directions that are parallel to each other. The main direction of a connecting lead is understood to be the direction that is parallel to the length of the connecting lead and that is orthogonal to the width of the connecting lead. The connecting leads and the inverse-parallel connecting leads can be realized as interdigitated structures. The transistor can be called a multi-finger transistor.

In one alternative embodiment, the first number N of conductive layers comprises a second number M of the lower conductive layers and a number N-M of the upper conductive layers. The first number N of conductive layers is preferably at least 2. The second number M can preferably have at least the value 1 and the maximum value N−1. The number N-M can thus have at least the value 1 and the maximum value N−1. The main directions of the number N-M of the upper conductive layers of the connecting lead and also the inverse-parallel connecting lead are parallel to each other. Likewise, the main directions of the second number M of the lower conductive layers of the connecting lead and also the inverse-parallel connecting lead are parallel to each other. In a top view onto the semiconductor body, the main directions of the connecting lead of the number N-M of the upper conductive layers are orthogonal to the main direction of the connecting lead of the second number M of the lower conductive layers. The conductivity of the upper conductive layers of the connecting lead can change from the first value to the second value per unit length. Likewise, the conductivity per unit length of the upper conductive layers of the inverse-parallel connecting lead can change from the first value to the second value. Alternatively, the width of the upper conductive layers of the connecting lead can change linearly from the first value to the second value. Accordingly, the width of the upper conductive layers of the inverse-parallel connecting lead can change linearly from the first value to the second value. Preferably, the conductivity of the upper conductive layers of the connecting lead can change linearly from the first value to the second value. Accordingly, the conductivity per unit length of the upper conductive layers of the inverse-parallel connecting lead can change linearly from the first value to the second value.

In one embodiment, the lower layers of the connecting lead and also the inverse-parallel connecting lead exhibit a constant width and thus a constant conductivity along their length. Alternatively, the lower conductive layers of the connecting lead and the inverse-parallel connecting lead have at least in some sections a wedge-shaped profile of the width, so that the conductivity per unit length is adapted to the current flowing through a cross section of the connecting lead or the inverse-parallel connecting lead.

The upper conductive layers of the connecting lead and the inverse-parallel connecting lead can be realized as interdigitated structures. The upper conductive layers of the connecting lead comprise the first plural number N1 of fingers of the interdigitated structure. Accordingly, the upper conductive layers of the inverse-parallel connecting lead comprise the second plural number N2 of fingers of the interdigitated structure. The sum of the first and the second plural numbers N1, N2 can be preferably at least three. The first and the second plural numbers N1, N2 differ by a maximum value of one. According to this embodiment, the first plural number N1 of the connecting leads can have a value that differs from a value of the third number N3 of semiconductor areas. Likewise, the second plural number N2 of the inverse-parallel connecting leads can have a value that differs from a value of the fourth number N4 of the other semiconductor areas. In this way, great flexibility in the design of the connecting leads for contacting the semiconductor area and the other semiconductor area is advantageously achieved. Advantageously, a very low on-resistance of the transistor can be achieved.

In one embodiment according to the proposed principle, a diode can have the connecting lead and the semiconductor area.

According to another aspect of the invention, a method for designing a semiconductor body comprises the steps of: a semiconductor area that is to be electrically contacted to a connecting lead is provided. A connecting lead is dimensioned such that it has a length W and its conductivity per unit length decreases from a first to a second value.

It is an advantage of the method that, in this way, the current flowing from the connecting lead to the semiconductor area per unit length and the voltage drop along the connecting lead are adjustable.

In one embodiment, the conductivity per unit length of the connecting lead can change in an approximately linear way from the first value to the second value. The connecting lead can comprise a first number N that is greater than one of conductive layers that are connected to each other by means of vertical vias.

The method for the design can be used for generating parameters for a realization of production masks. The data can be fed to an optical pattern generator or to an electron beam plotter. Alternatively, the method can be used for design, in order to generate data for direct illumination of one or more photosensitive layers in the production of the semiconductor body.

The method for the design can be carried out by means of a computer program product. On the computer program product, the processing steps can be stored.

BRIEF DESCRIPTION OF THE DRAWINGS

The invention will be explained in greater detail below using several embodiments with reference to the figures. Areas and structures with identical functions or effects carry FIG. 1 shows an example embodiment of a connecting lead according to the invention, FIGS. 5A-5F show example profiles of conductivity values per unit length and a width of the connecting lead as a function of a coordinate according to the invention, FIGS. 9A-9D show alternative transistors with other example embodiments of connecting leads according to the invention.

DETAILED DESCRIPTION OF THE DRAWINGS

Figure 2A:
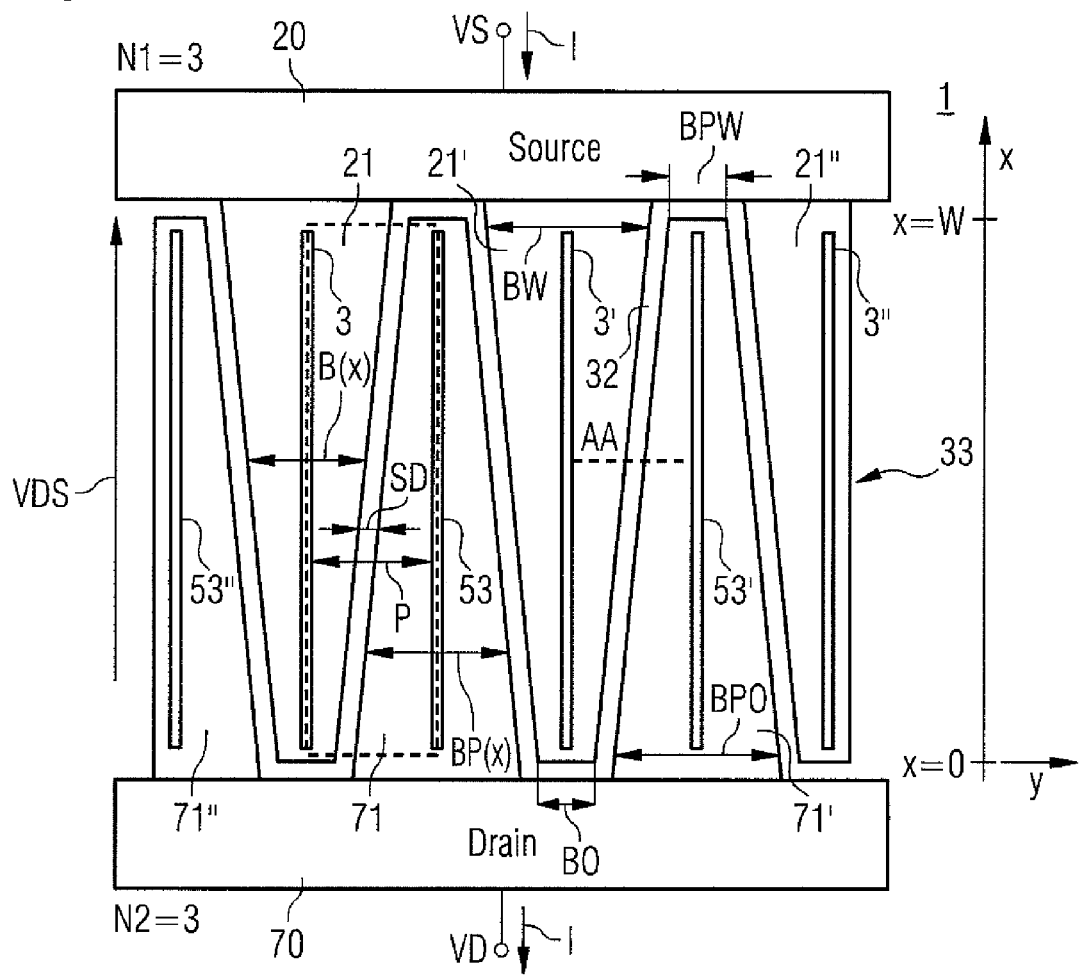
FIGS. 2A and 2B show an example embodiment of a transistor in top view and as a cross section according to the invention.

FIG. 1 shows an example embodiment of a connecting lead according to the invention in top view onto a semiconductor body 1. The semiconductor body 1 comprises the connecting lead 21, a supply line 20, a semiconductor area 2, and a contact area 3. The semiconductor area 2 is constructed as a rectangle with the width Bd. The connecting lead 21 is realized approximately as a triangle. A length of the connecting lead 21 has a value W. The supply line 20 is connected to one side 22 of the triangle of the connecting lead 21. The side 22 has the x-coordinate x=W. The apex of the triangle of the connecting lead 21 opposite the side 22 is flattened and has the x-coordinate x=0. The flattened or trapezoidal shape is caused by the minimum width of the metal strips defined by the fabrication process. These strips are specified using design rules. Design rules are specified by a fabrication line for each semiconductor integration process. The design rules comprise, for example, the minimum width of a metallization line, the minimum distance between two metallization lines or the minimum width of an opening in an isolator. Another example is the minimum channel length of a field effect transistor. A person who makes a design or a layout for an integrated circuit has to follow the design rules. A design software which is used by such a person also has to use the design rules. If a mask layout of an integrated circuit obeys all design rules, the fabrication line can successfully fabricate the integrated circuit. For process families such as 0.35 μm Opto-CMOS, 0.35 μm SiGe—BiCMOS, 0.18 μm HV-CMOS, 0.18 μm CMOS, different design rules are specified for each of these process families. Some typical design rules can be found at (http://www.austriamicrosystems.com/eng/content/view/full/7939) which states "Design rules specify all rules necessary to create valid geometrical layouts and include:
   Definitions
   General Requirements
   Process Layer Overview
   Structure Rules (override Process Layer Rules)
   Element Rules (override Structure Rules and Process Layer Rules)
   Periphery Rules
   Guidelines
   Recommended Layout Structures"

The connecting lead 21 is in electrical contact in the contact area 3 with the semiconductor area 2. The contact area 3 is smaller than the connecting lead 21, so that the connecting lead 21 reliably covers the contact area 3 even for under-etching or off-setting when the masks are aligned. The contact area 3 is constructed essentially as a rectangle. The contact area 3 can be constructed as a via. At the coordinate x=w, the connecting lead 21 has a first value BW for the width and also a first value SW for the conductivity per unit length. At the coordinate x=0 the connecting lead 21 has a second value B0 of the width and a second value of the conductivity S0. Because the width B(x) of the connecting lead 21 increases linearly between the location x=0 up to the location x=W, the conductivity S(x) per unit length of the connecting lead 21 increases linearly between x=0 and x=W.

Through the supply line 20 flows a current I that passes through the side 22 of the connecting lead 21 and is fed by the connecting lead 21 via the contact area 3 to the semiconductor area 2. A current that flows through a cross section of the connecting lead 21 at a coordinate x<W thus has a smaller value than the current T.

Advantageously, by means of the width B(x) and the resulting different conductivity values per unit length S(x) of the connecting lead 21 it is set that the connecting lead 21 has a high conductivity SW at the position at which the current flow through the connecting lead 21 is high. In this way, a voltage gradient at this position x=W is kept low. At the position at which the connecting lead 21 ends, namely at x=0, the current flow in the connecting lead 21 is zero.

Advantageously, by means of the position-dependent width B(x) of the connecting lead 21, the current distribution in the contact area 3 can be set.

In an alternative embodiment, the contact area 3 comprises several individual areas that have square constructions and that are connected in parallel between the connecting lead 21 and the semiconductor area 2. Alternatively, the individual areas of the contact area 3 have a rectangular or circular construction in a top view. According to the alternative embodiment, in a three-dimensional diagram, the individual areas of the contact area 3 can have a right parallelepiped or cylindrical construction.

Figure 2B:
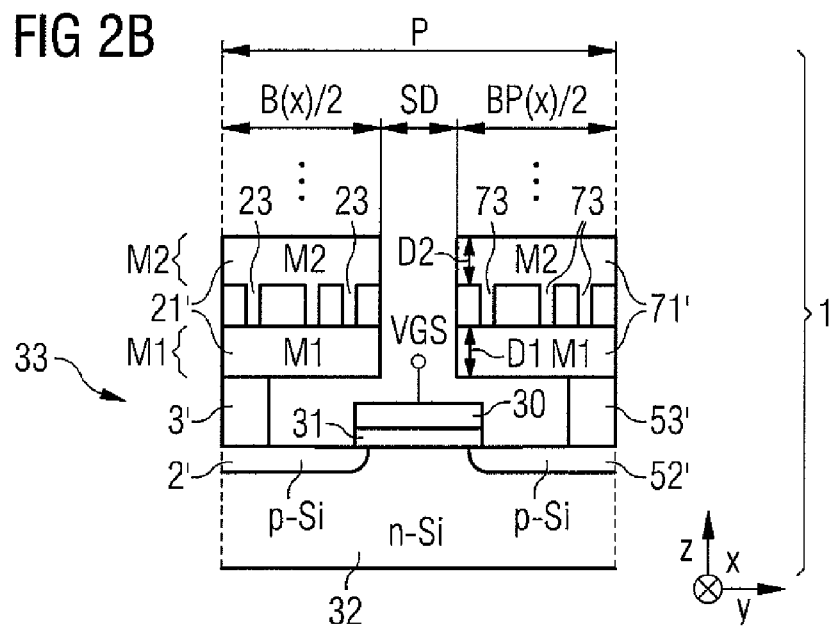

FIGS. 2A and 2B show an example embodiment of a transistor with a connecting lead according to the invention. FIG. 2A shows a top view. The transistor 33 comprises the supply line 20 that is constructed as a source supply line and another supply line 70 that is realized as the drain supply line. The source can also be called the supply and the drain can be called the sink. Three connecting leads 21, 21', 21" are connected to the supply line 20. Thus, a first plural number N1=3 fingers are connected to the source supply line 20, wherein each finger comprises one of the connecting leads 21, 21', 21". Each connecting lead 21, 21', 21" contacts one of the three contact areas 3, 3', 3". The contact areas 3, 3', 3" lead to semiconductor regions 2 not shown in FIG. 2A. The width B(x) of the connecting lead 21, 21' decreases from a first value BW close to the supply line 20 to a second value B0. Because a current flows from the contact areas 3, 3' in the semiconductor body 1 both in the y-direction and also in the negative y-direction and because a current flows from the contact area 3" only in the negative y-direction, the connecting leads 21, 21' are approximately twice as wide as the connecting lead 21".

In a corresponding way, inverse-parallel connecting leads 71, 71', 71" that lead to several other contact areas 53, 53', 53" are connected to the additional supply line 70. The inverse-parallel connecting lead 71, 71' has a width BP(x). In this way, a second plural number N2=3 fingers are connected to the drain supply line 70, wherein each finger comprises one of the inverse-parallel connecting leads 71, 71', 71". The contact areas 53, 53', 53" are used for contacting several additional semiconductor areas 52 that are not shown in FIG. 2A. The connecting leads 21, 21', 21" and the inverse-parallel connecting leads 71, 71', 71" are thus realized as interdigitated structures.

A current I fed to the supply line 20 is thus distributed into the three connecting leads 21, 21', 21" and is fed from there via the three contact areas 3, 3', 3" to three semiconductor areas 2. The current I flows from the semiconductor areas 2 through a substrate 32 of the semiconductor body 1 to the other semiconductor areas 52 and from there through the three other contact areas 53, 53', 53" to the three inverse-parallel connecting leads 71, 71', 71" and thus to the other supply line 70. A magnitude of the current I depends on a gate-source voltage VGS on a gate electrode 30 that is not shown in FIG. 2A but is shown in FIG. 2B and on a drain-source voltage VDS between the supply line 20 and the other supply line 70. Furthermore, the current I is dependent on a resistance of the supply line 20, a resistance of the other supply line 70, the resistance values of the connecting leads 21, 21', 21", and the resistance values of the inverse-parallel connecting leads 53, 53', 53".

Advantageously, the width B(x) of the connecting lead 21, 21', 21" is realized at each position with a large value at which the current through each connecting lead 21, 21', 21" has the greatest current value. Because the contact areas 3, 3', 3" and the other contact areas 53, 53', 53" are connected in inverse-parallel, the width B(x) of the connecting lead 21, 21' is advantageously constructed at the coordinate x=W with a large value BW and the width BP(x) of the inverse-parallel connecting lead 71, 71' is constructed at the coordinate x=W with a small value BPW. Advantageously, the width B(x) of the connecting lead 21, 21' at the coordinate x=0 is constructed with a small value B0 and the width BP(x) of the inverse-parallel connecting lead 71, 71' at the coordinate x=0 is constructed with a large value BP0. Therefore, the sum of the width B(x) of the connecting lead 21, 21' and the other width BP(x) of the inverse-parallel connecting lead 71, 71' at a value of the coordinate x is approximately constant. Advantageously, through the dimensioning of the width B(x) of the connecting leads, the conductivity of the connecting leads is set so that the overall resistance value of the connecting leads is kept small. In one embodiment, an area of the transistor 33 can be constructed as a rectangle that comprises the connecting leads 21, 21', 21" and the inverse-parallel connecting leads 71, 71', 71".

FIG. 2B shows a cross section of the transistor 33 that is shown in FIG. 2A in a top view. The position of the transistor 33 designated in FIG. 2A with the letters AA is shown. In FIG. 2B, the cross section of a regularly repeating part of the structure of the semiconductor body 1 is shown that comprises a grid width P, or pitch. The transistor 33 is constructed as a metal-oxide semiconductor field-effect transistor, abbreviated MOSFET. The semiconductor body 1 has a semiconductor area 2' and also another semiconductor area 52'. The semiconductor area 2' is used as a source-diffusion area and the additional semiconductor area 52' is provided as a drain-diffusion area. The semiconductor body 1 also comprises a gate isolator 31 and a gate electrode 30 that are arranged above the substrate 32 between the semiconductor area 2' and the additional semiconductor area 52'. The semiconductor area 2' is connected via the contact area 3' to the connecting lead 21'. In a corresponding way, the other semiconductor area 52' is connected via the other contact area 53' to the inverse-parallel connecting lead 71'. The contact area 3' comprises a via that is filled with a conductive material. The conductive material of the contact area 3' is the conductive material of the connecting lead 21'.

The connecting lead 21' and the inverse-parallel connecting lead 71' feature a spacing SD between each other. The spacing SD corresponds to a minimum, given spacing of the strip conductors. Advantageously, the contact areas 3, 3', 3" and also the other contact areas 53, 53', 53" are arranged in parallel and thus the semiconductor area 2, 2', 2" or 52' are also realized in parallel with a rectangular form. An increase in the width BP(x) of the inverse-parallel connecting lead 71' with increasing x is equalized by a decrease in the width B(x) of the connecting lead 21'. The relationship between the pitch P of the contact areas 3, 53, the spacing SD of one connecting lead to an adjacent, inverse-parallel connecting lead, the width B(x) of the connecting leads 21, 21' and the width BP(x) of the inverse-parallel connecting leads 71, 71' is given by the following equation:

$$P = SD + \frac{B(x) + BP(x)}{2}$$

The connecting lead 21' comprises a first and a second conductive layer M1, M2. The first conductive layer M1 is connected via vertical contact positions 23, or vias, to the second conductive layer M2. Likewise, the inverse-parallel connecting lead 71' has the first and the second conductive layer M1, M2. The first conductive layer M1 of the inverse-parallel connecting lead 71' is connected via other vertical vias 73 to the second conductive layer M2 of the inverse-parallel connecting lead 71'. The first conductive layer M1 has a first thickness D1. In contrast, the second conductive layer M2 has a second thickness D2. The first thickness D1 can have the same value as the second thickness D2.

The gate-source voltage VGS is fed to the gate electrode 30.

In one alternative embodiment, the connecting lead 21' and the inverse-parallel connecting lead 71' have only one conductive layer M1. In another alternative embodiment, the connecting lead 21' and the inverse-parallel connecting lead 71' have more than two conductive layers M1, M2, M3, M4.

In one alternative embodiment, the contact areas 3', 53' are of a different conductive material than the first conductive layer M1 of the connecting leads 21', 71'.

In an alternative, not-shown embodiment, a value of the first thickness D1 and a value of the second thickness D2 can be different. Preferably, the value of the second thickness D2 can be greater than the value of the first thickness D1. According to this embodiment, a spacing SD' of the second conductive layer M2 can have a larger value than the spacing SD of the first conductive layer M1.

Figure 3A:
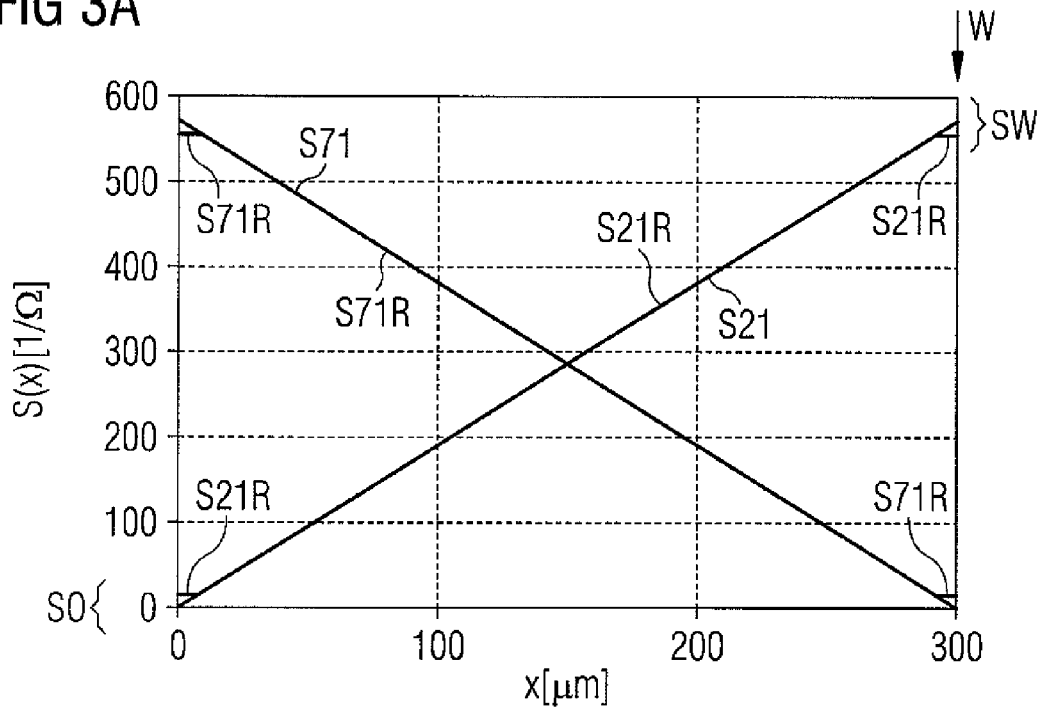
FIGS. 3A and 3B show example profiles of conductivity and current values per unit length of a connecting lead as a function of a coordinate according to the invention.

FIG. 3A shows the conductivity per unit length S(x) as a function of the coordinate x of a connecting lead 21 for an n-channel MOSFET with a channel width W of approximately 300 μm. The connecting lead 21 and the inverse-parallel connecting lead 71 comprise four conductive layers M1, M2, M3, M4 that are also called metallization layers M1, M2, M3, M4. At the location x=0 the inverse-parallel connecting lead 71 begins and at the location x=300 μm the inverse-parallel connecting lead 71 ends. Conversely, the connecting lead 21 ends at the location x=0 and the connecting lead 21 begins at the location x=300 μm. FIG. 3A shows both given values S21 for the conductivity S(x) of the connecting lead 21 and given values S71 for the conductivity S(x) of the inverse-parallel connecting lead 71 and also the conductivity values S21R for the connecting lead 21 and S71R for the inverse-parallel connecting lead 71 achieved in an actual design. The conductivity S(x) of the connecting lead 21 increases from the value S0 that is approximately 0 at the location x=0 linearly up to the value SW at the location x=300 μm, while the conductivity S(x) of the inverse-parallel connecting lead 71 decreases from a value at the location x=0 to a value approximately 0 at the location x=300 μm. In this embodiment, the maximum values of the conductivity of the connecting lead 21 and the inverse-parallel connecting lead 71 are approximately equal. The values S21R and S71R simulated with reference to a design deviate only slightly, that is, at the locations x=0 and x=300 μm, from the given values S21 and S71, because the design rules do not permit connecting leads, in particular, metal strips, with a width B(x) less than a given, minimum width Bmin.

Figure 3B:
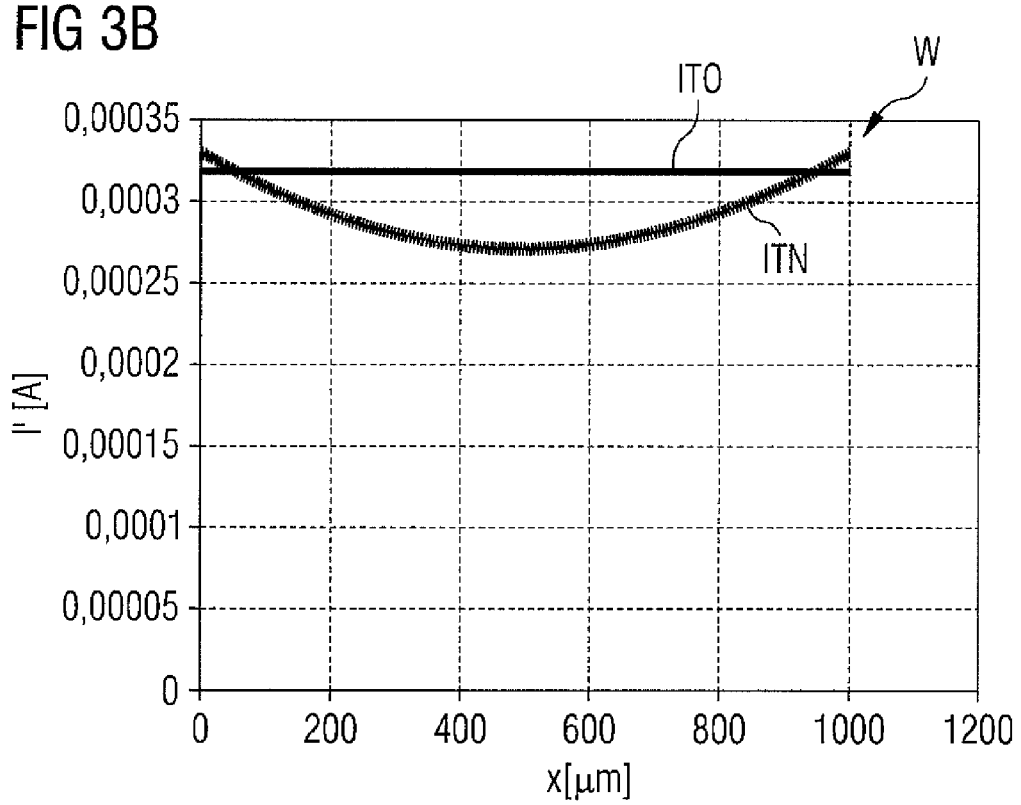

FIG. 3B shows the current distribution I', that is, the current per unit length in the channel of a transistor 33 with a width W of approximately 1000 μm along the coordinate x of the connecting lead 21 or of the channel. An n-channel MOSFET is shown with a pitch P of 5.55 μm, a resistance Ron of 8800 Ohm/μm, and a drain-source voltage VDS=0.1 V. The transistor 33 has four metallization layers M1-M4. The straight line ITO in FIG. 3B shows the current distribution I' as a function of the location x in the channel for a transistor 33 that has a connecting lead 21 and an inverse-parallel connecting lead 71 according to the invention. The parabolic curve $I_{TN}$ in FIG. 3B shows the dependence of the current distribution I' on the location x in the channel of a transistor with rectangular connecting leads that thus have a constant width and a constant conductivity per unit length and are thus not optimized.

Advantageously, the simulation results show that a more uniform current distribution I' can be achieved with the connecting lead 21 according to the invention. In addition, as shown in FIG. 3B, the total current I of the transistor 33 according to the invention is higher than for the non-optimized transistor at the same voltages, so that the transistor 33 according to the invention has a lower total resistance compared with a transistor with rectangular connecting leads. The current I can be given from the current distribution I' through integration over the coordinate x.

Figure 4A:
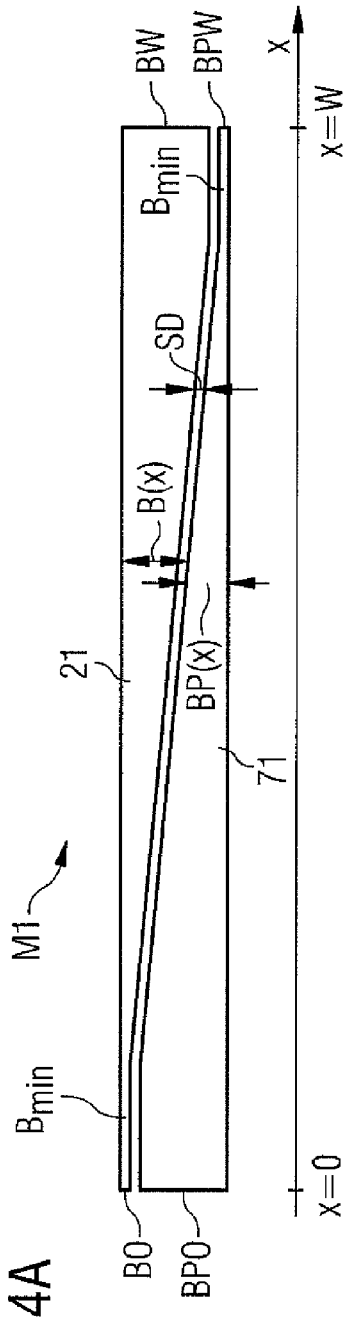
FIGS. 4A-4C show example embodiments of a connecting lead and an inverse-parallel connecting lead according to the invention.
Figure 4B:
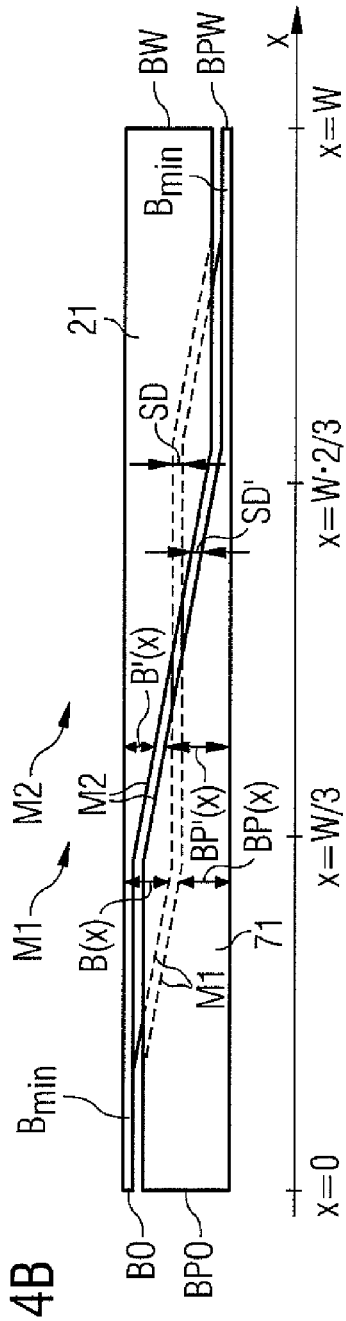
Figure 4C:
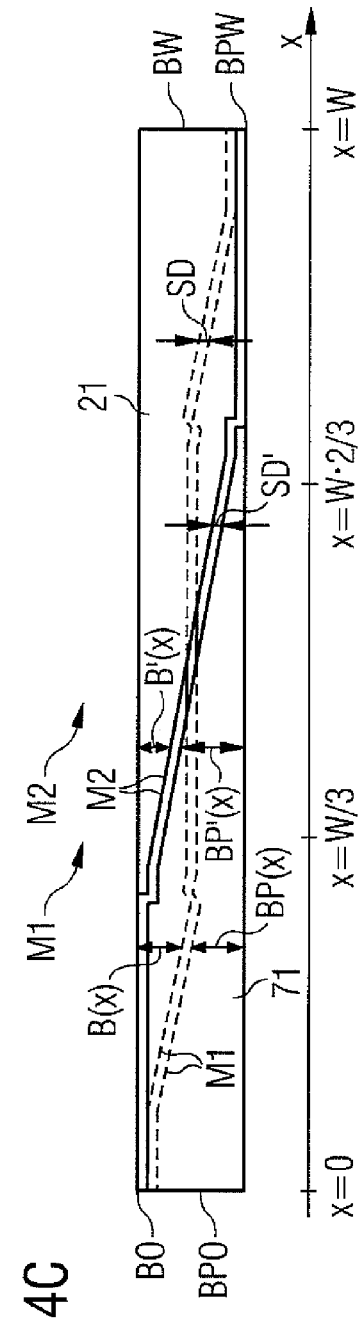

FIGS. 4A-4C show, in a top view, example embodiments of connecting leads 21 and inverse-parallel connecting leads 71 according to the invention. FIG. 4A shows a connecting lead 21 comprising a metallization layer M1. Due to a given value Bmin for the minimum width of a strip conductor, the connecting lead 21 and the inverse-parallel connecting lead 71 deviate from a triangular shape. In this way it is guaranteed that the connecting lead 21 can also be realized in the area in which it should have a very small value in the scope of a semiconductor technology process. FIG. 4A shows that the connecting lead 21 increases from the value B0 with increasing x across a wide area to the value BW linearly, while the inverse-parallel connecting lead 71 decreases linearly from the value BP0 to the value BPW that is the value of the minimum strip conductor width Bmin.

FIG. 4B shows another example layout for a connecting lead 21 and an inverse-parallel connecting lead 71 with two conductive layers M1, M2, also called metallization layers. The two metallization layers M1, M2 are connected to each other with contacts 23, 73, or vias, in the areas in which two metallization layers M1, M2 belong to the connecting lead 21 or in which two metallization layers M1, M2 belong to the inverse-parallel connecting lead 71. At x=0 the connecting lead 21 has the two metallization layers M1, M2 with the given minimum width of the strip conductor Bmin, while at x=W the two metallization layers M1, M2 of the inverse-parallel connecting lead 71 exhibit the minimum given value Bmin for a strip conductor. In the example embodiment according to FIG. 4B, with increasing x between x=0 to x=⅓*W, the width BP(x) of the first metallization layer M1 of the inverse-parallel connecting lead 71 decreases and the width B(x) of the first metallization layer M1 of the connecting lead 21 increases. In an area between approximately x=⅓*W to x=⅔*W the widths B(x), BP(x) of the first metallization plane M1 for the connecting lead 21 and the inverse-parallel connecting lead 71 are approximately constant, before the width B(x) of the first metallization plane M1 of the connecting lead 21 increases between x=⅔*w and x=W to the maximum value BW. In contrast, the widths B'(x), BP'(x) of the second metallization plane M2 are approximately constant at x=0 up to x=⅓*W and the width B'(x) of the connecting lead 21 of the second metallization plane M2 increases in an area between x=⅓*W up to x=⅔*W, while the width BP'(x) of the second metallization plane M2 of the inverse-parallel connecting lead 71 decreases in this area. Between x=⅔*W up to x=W, the widths B'(x), BP'(x) of the second metallization plane M2 are approximately constant both for the connecting lead 21 and also for the inverse-parallel connecting lead 71.

FIG. 4C shows an alternative embodiment of a connecting lead 21 and an inverse-parallel connecting lead 71 with two metallization layers M1, M2. The width B'(x) of the second metallization plane M2 that is allocated to the connecting lead 21 is zero in the area between x=0 up to approximately x=⅓*W. The width B'(x) of the second metallization plane M2, belonging to the connecting lead 21, increases between x=⅓*W up to x=⅔*W and remains at the maximum value BW up to x=W. Accordingly, the width BP'(x) of the second metallization plane M2 that is allocated to the inverse-parallel connecting lead 71 remains constant in the area x=0 up to x=⅓*W, decreases in the following area, and is zero after x=⅔*W. The first metallization plane M1 changes its width B(x) in the areas between x=0 and x=⅓*W or x=⅔*W up to x=W and is approximately constant in the middle area between x=⅓*W and x=⅔*W. Because the second metallization plane M2 should have no width below a minimum, given value Bmin, the beginning or the ramp of the second metallization plane M2 is compensated by means of a curved profile of the first metallization plane M1.

One advantage of the embodiment according to FIG. 40 is that for metallization planes that are used completely or only in some sections in one of the two connecting leads 21, 71, the design rules for the minimum spacing are not applied, which further reduces the metallization-resistance.

FIGS. 5A-5F show profiles of the conductivity S(x) and the width B(x) of the connecting lead 21 and the inverse-parallel connecting lead 71 according to the embodiments shown in FIGS. 4A-4C and other embodiments.

FIG. 5A shows the conductivity S(x) per unit length of the connecting lead 21 as a function of the location x. The line SNO gives the conductivity of a rectangular connecting lead. The ideal profile of the conductivity SOP can be described by a straight line through the origin and by the value 145 1/Ohm at the location x=300 μm. For the simulation, a connecting lead 21 with two metallization planes M1, M2 was assumed.

The values SAB give the conductivity S(x) of the connecting lead 21 according to the FIGS. 4A and 4B. The values SC give the values of the conductivity S(x) of the connecting lead 21 according to FIG. 4C.

FIG. 5B gives the width B(x) of the first metallization plane M1 of the connecting lead 21 and the width B'(x) of the second metallization plane M2 of the connecting lead 21, as shown in FIG. 4B.

FIG. 5C gives the width B(x) of the first metallization plane M1 of the connecting lead 21 and the width B'(x) of the second metallization plane M2 of the connecting lead 21, as shown in FIG. 4C.

FIG. 5D shows the conductivity per unit length S(x) as a function of the location x for a transistor 33 with four metallization planes. The first, the second, and the third metallization plane M1, M2, M3 have the same conductivity and essentially equal values for a minimum spacing SD''' according to the design rules. The fourth metallization plane M4 has a seven-fold higher conductivity but also greater values for a minimum spacing SD according to the design rules. In FIG. 4A the first metallization plane M1 is shown. For the simulation whose results are shown in FIG. 5D, four metallization planes M1-M4 were assumed that have approximately identical shapes as the first metallization plane M1 shown in FIG. 4A. Advantageously, such a transistor 33 is easy to design because the different metallization layers M1-M4 have the same shape. The horizontal line at S=280 l/Ohm corresponds to a conductivity SNO for rectangular connecting leads. The optimum line SOP of the conductivity S(x) of the connecting lead 21 is given by a straight line through the origin and through the point x=300 µm and SW≈560 l/Ohm. The conductivity values SAB that can be achieved with connecting leads 21 according to FIGS. 4A and 4B for four metallization layers M1-M4 lie on the optimum line SOP of the conductivity S(x) only in a middle region. In contrast, advantageously the conductivity values SC of a transistor 33 realized analogously to FIG. 4C with four metallization layers M1-M4 lie on the optimum line SOP apart from very small areas at x=0 and x=300 µm.

Figure 5E:
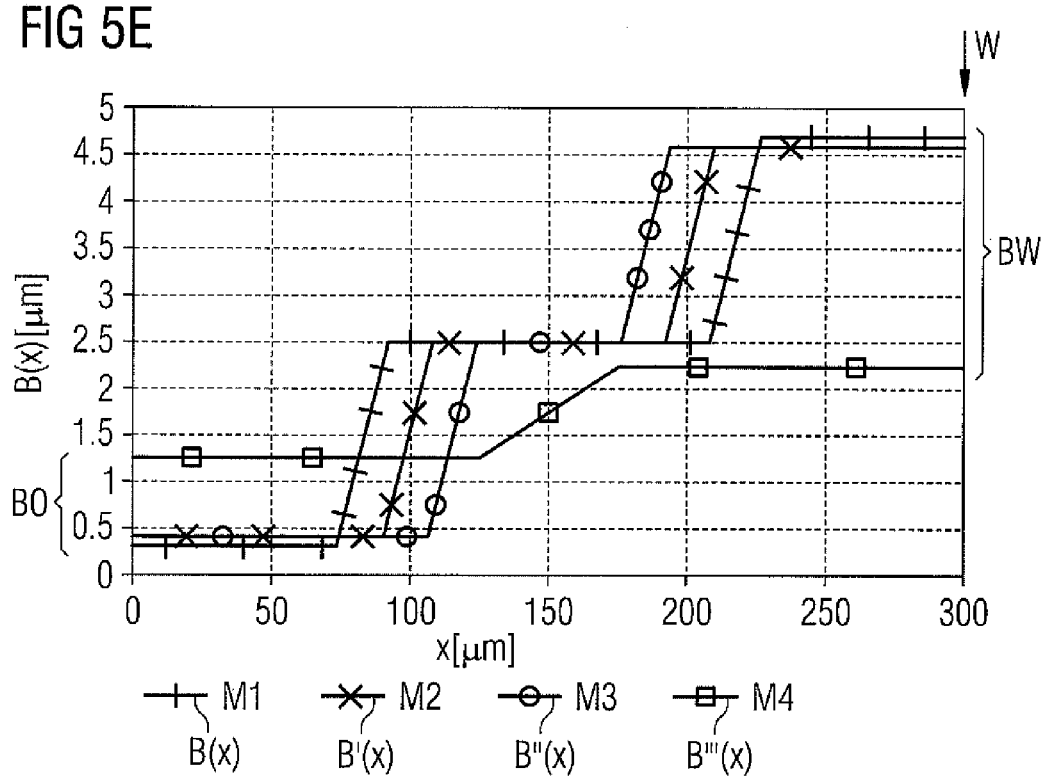

FIG. 5E shows the widths B(x) of the four metallization layers M1-M4 of the connecting lead 21 as a function of the location x in a way analogous to FIG. 4B.

Figure 5F:
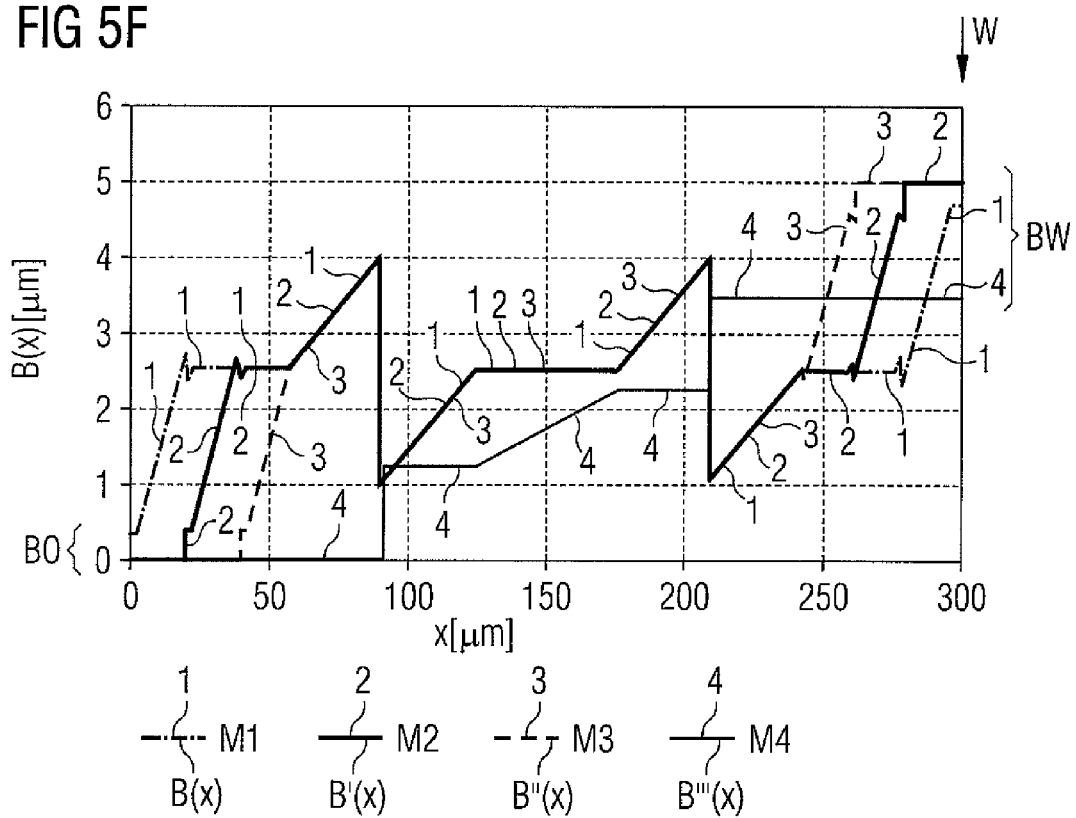

FIG. 5F shows the width of the four metallization layers M1-M4 of the connecting lead 21 as a function of the location x in a way analogous to FIG. 4C. Advantageously, due to such dimensioning of the width B(x) of the first metallization layer M1, the width B'(x) of the second metallization layer M2, a width B''(x) of the third metallization layer M3, and a width B'''(x) of the fourth metallization plane M4, an ideal profile of the conductivity SOP per unit length shown in FIG. 5D can be set.

It is an advantage of the embodiment according to FIG. 5F that for metallization layers that are used completely or only in some sections in one of the two connecting leads 21, 71, the design rules for the minimum spacing are not applied, which further reduces the metallization-resistance.

Figure 6A:
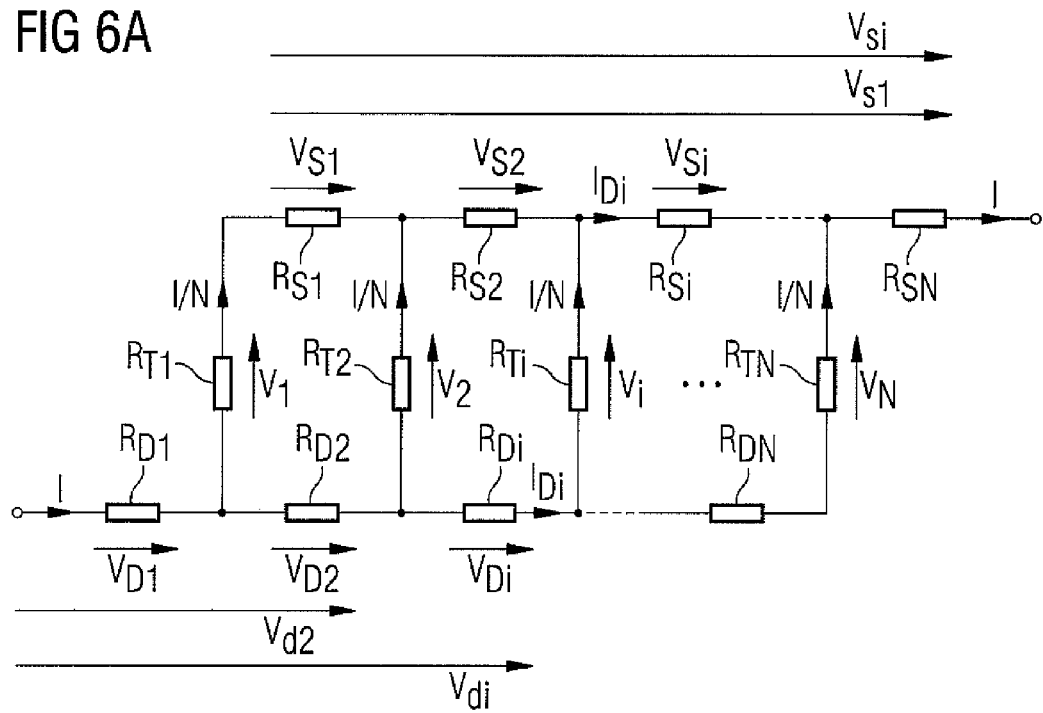
FIGS. 6A-6C show models of transistors with connecting leads.
Figure 6B:
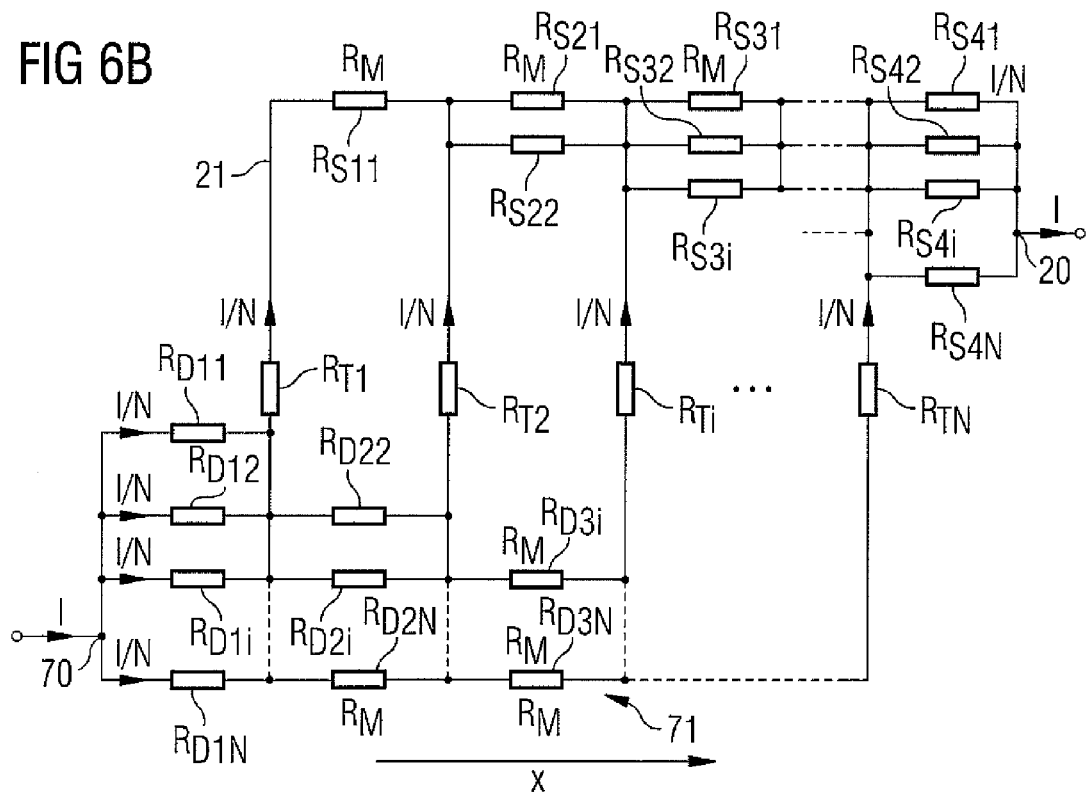
Figure 6C:
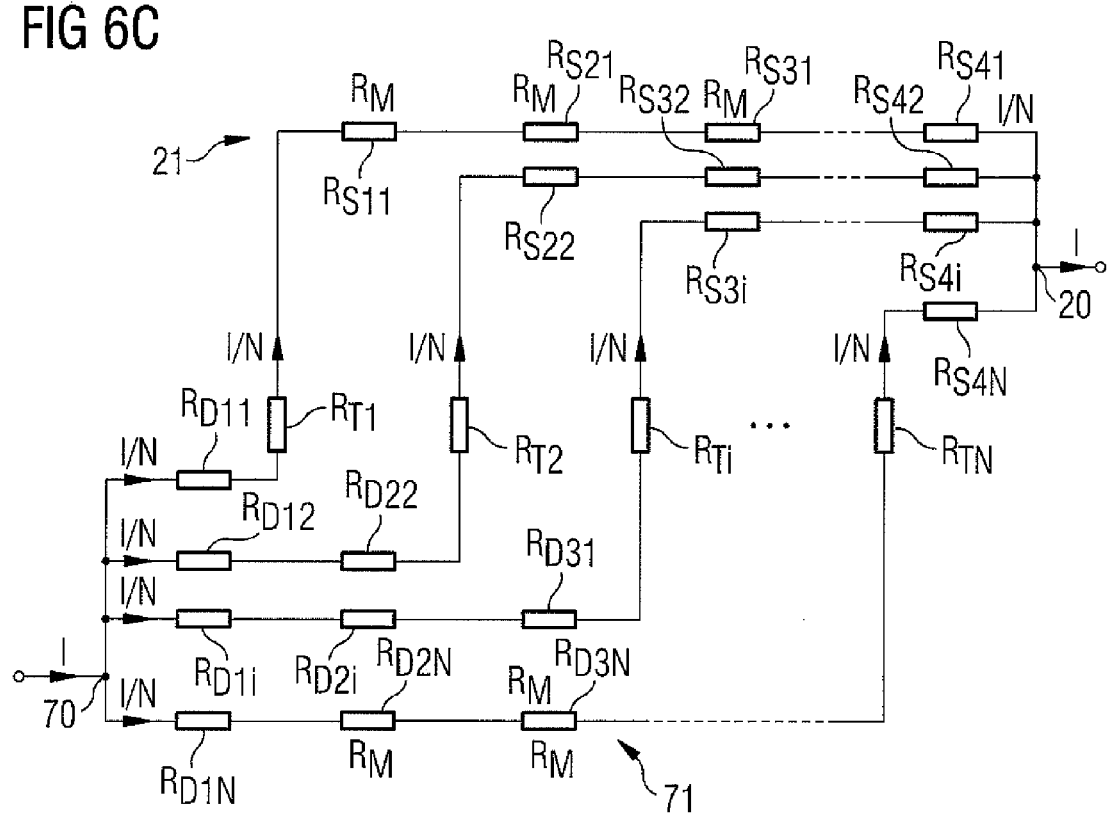

FIGS. 6A-6C show models of different transistors. FIG. 6A shows a simplified equivalent circuit diagram of a transistor with a rectangular connecting lead and a rectangular inverse-parallel connecting lead. Due to the rectangular shape of the inverse-parallel connecting lead, the resistors RD1, RD2, RDi, and RDN are constant. Likewise, due to the rectangular shape of the connecting lead, the resistors RS1, RS2, RSi, and RSN are approximately the same size.

FIGS. 6B and 6C show equivalent circuit diagrams of a transistor 33 with a connecting lead 21 and an inverse-parallel connecting lead 71 according to the invention. In FIG. 6B the inverse-parallel connecting lead 71 connected to the drain supply line 70 is modeled by a parallel circuit of N resistors $R_{D11}$, $R_{D12}$, $R_{D1i}$, $R_{D1N}$ with N=4 resistors, after which a parallel circuit made from three resistors $R_{D22}$, $R_{D2i}$, $R_{D2N}$ is connected, after which follows a parallel circuit, in turn, made from two resistors $R_{D3i}$, $R_{D3N}$. The transistor 33 is simulated by a parallel circuit made from N sub-transistors $R_{T1}$, $R_{T2}$, $R_{Ti}$, $R_{TN}$ through each of which a current I/N flows. Thus a current with the value I/N that flows through the first resistor $R_{D11}$ of the first parallel circuit then flows through the first sub-transistor $R_{T1}$ to the connecting lead 21 of the source supply line 20. Furthermore, a current that flows through the second resistor $R_{D22}$ in the second parallel circuit then flows through the second sub-transistor $R_{T2}$ to the connecting lead 21. FIG. 6C shows that the resistors $R_{D11}$, $R_{D12}$, $R_{D1i}$, $R_{D1N}$ of the first parallel circuit of the inverse-parallel connecting lead 71 are connected to each other at a terminal and are coupled with the drain supply line 70 and are not connected to each other at another terminal in contrast to FIG. 6B, but instead are connected individually to their associated sub-transistor $R_{T1}$, $R_{T2}$, $R_{Ti}$, $R_{TN}$. This is possible such that the potential on the second terminal of each N resistor $R_{D11}$, $R_{D12}$, $R_{D1i}$, $R_{D1N}$ of the first parallel circuit is identical and also the current flowing through each of the resistors $R_{D11}$, $R_{D12}$, $R_{D1i}$, $R_{D1N}$ has approximately the same value I/N. Thus, each portion of a current I/N flows through a first plural number of resistors in the inverse-parallel connecting lead 71 and through a second plural number of resistors in the connecting lead 21, wherein the sum from the first plural number and the second plural number for each of the different current paths is constant. Thus, from the equivalent circuit diagram according to FIG. 6C it follows that the linear increase in the conductivity S(x) with increasing x makes a uniform current distribution in the channel area of the transistor 33 easier and represents an advantageous setting for the dimensioning of the connecting lead 21 or the inverse-parallel connecting lead 71.

A design of suitable connecting leads can be derived as follows: a transistor 33 with the width W can be simulated by a parallel circuit of N sub-transistors of which each has a width W'=W/N. In FIG. 6A, an equivalent circuit diagram of a realistic transistor strip is shown. The horizontally arranged transistor represents the metallization-resistance for the source-side and the drain-side metal connection, in contrast, the vertically arranged resistor RT represents the on-resistance of the transistor.

In the case of a current not distributed uniformly on the N sub-transistors $R_{T1}$, $R_{T2}$, $R_{Ti}$, $R_{TN}$, that is, for I1 not equal to I2, etc., parts of the transistor strip are not completely used, so that the on-resistance increases. Therefore, a uniform current distribution is to be achieved through a suitable connecting lead 21.

This is the case when the voltage drops V1, V2, Vi, VN along each of the sub-transistors $R_{T1}$, $R_{T2}$, $R_{Ti}$, $R_{TN}$ are equal, that is, V1=V2=Vi=VN. This means that the voltage drop across $R_{S,i}=R_{D,i+1}$ equals:

$$V_{S_i} = V_{D_{i+1}} \qquad (1)$$

The current through the resistor $R_{Di}$ equals:

$$I_{D_i} = I - (i-1) \cdot \frac{I}{N} = \frac{I \cdot (N - i + 1)}{N} \quad (2)$$

The current through the resistor $R_{Si}$ equals:

$$I_{S_i} = i \cdot \frac{I}{N} \quad (3)$$

Combining Equations 1, 2, and 3 gives:

$$R_{S_i} \cdot i \cdot \frac{I}{N} = R_{D_{i+1}} \cdot \frac{I \cdot (N-i)}{N} \quad (4)$$

From Equation 4, a relationship between the resistance on the source side and the drain side can be derived:

$$R_{D_{i+1}} = R_{S_i} \cdot \frac{i}{N-i} \quad (5)$$

A suitable layout in which the current is distributed uniformly across the complete transistor strip should satisfy Equation 5. The available conductivity $\sigma_M$ of the drain-side and the source-side metal resistor is given by the pitch P and the design rules for metallization:

$$\sigma_M = \frac{N \cdot (P - SD)}{W \cdot R_{sq}} \quad (6)$$

Here, W is the width of the transistor strip, P is the pitch, and SD is the spacing, as defined in FIG. 2B. In the case that several back-end metallization layers M1 to M4 are available, the conductivity for each metallization layer is calculated according to Equation 6 and the conductivity values are then added.

The available conductivity is an initial condition for Equation 5:

$$\sigma_M = \frac{1}{R_{D_{i+1}}} + \frac{1}{R_{S_i}} \quad (7)$$

The available conductivity is divided into N parallel resistors each with the following value:

$$R_M = \frac{N}{\sigma_M} \quad (8)$$

The resistors $R_{D,i}$, $R_{S,i}$ in FIG. 6A can be drawn as a parallel circuit of i and (N-i) resistors with the resistance value $R_M$, so that Equation 5 is satisfied, as shown in FIG. 6B.

Because each resistor shown in FIG. 6B carries the same current I/N, the parallel circuit can be divided, so that the equivalent circuit diagram according to FIG. 6C is produced. The resistance of this circuit can now be calculated. The metallization-resistance for each current path equals $R_M*N$.

Because there are N parallel current paths, the metallization-resistance is given from the combination of Equations 6 and 8:

$$R_M = \frac{W \cdot R_{sq}}{P - SD} \quad (9)$$

Equation 9 represents the formula for the resistance value of a line with the sheet resistance $R_{sq}$, the width W, and a length given from the pitch P and the metallization spacing SD.

The spacing SD can be included in the sheet resistance:

$$R_{SQ} = \frac{R_{sq}}{P - SD} \cdot P \quad (10)$$

Equation 9 thus simplifies to:

$$R_M = \frac{W \cdot R_{SQ}}{P} \quad (11)$$

If several metallization layers M1 to M4 are used, the total metal resistance value produces:

$$R_{SQ} = \frac{1}{\sum_{i=1}^{N_M} \frac{1}{R_{SQ_{Mi}}}}, \quad (12)$$

where $N_M$ is the first number of metallization planes M1 to M4 and $R_{SQ_{Mi}}$ is calculated by means of Equation 10.

The transistor resistance for a width W and a specified value for the on-resistance $R_{on}$ in Ohm/μm equals:

$$R_T = \frac{R_{on}}{W} \quad (13)$$

From Equations 11 and 13 the following relationship can be derived:

$$W = \sqrt{\frac{R_M}{R_T} \cdot P \cdot \frac{R_{on}}{R_{SQ}}} \quad (14)$$

A doubling of the pitch P produces a strip width that is greater by the factor $\sqrt{2}$, if the same relationship of the metallization-resistance to the transistor resistance is to be maintained.

In the following, a calculation of the metallization-resistance for an arrangement of the connecting leads is considered perpendicular to the width W. The connecting lead 24 can thus be orthogonal to the longer side of the contact area 3', as shown, for example, in FIGS. 7A, 9B, and 9C. The equations for calculating the metal resistance and the transistor resistance are similar to the equations for the calculation of a strip. For a selected pitch $P_M$ of the metallization and a drain-substrate width P the transistor resistance is given by:

$$R'_{on} = R_{on} \cdot \frac{P}{P_M} \quad (15)$$

The metallization-resistance value is analogous to Equation 9; but the metallization pitch $P_M$ is to be used for the pitch:

$$R_M = \frac{W \cdot R_{sq}}{P_M - SD} = \frac{W \cdot R'_{sq}}{P_M} \quad (16)$$

Here, the sheet resistance Rsq' is used, in order to maintain the spacing rules for the metallization:

$$R'_{sq} = \frac{R_{sq} \cdot p_M}{P_M - SD} \quad (17)$$

The transistor resistance value is given from:

$$R_T = \frac{R_{on}}{W} \cdot \frac{P}{P_M} \quad (18)$$

Equation 14 here remains unchanged.

In a method for designing a circuit, a value of an on-resistance is specified and it is determined by means of the above equations whether a first transistor 33 has smaller minimum surface area requirements compared with a second transistor 33'. The first transistor 33 has a contact area 3 and another contact area 53 that are arranged parallel to the connecting lead 21 and the inverse-parallel connecting lead 71. The second transistor 33' comprises a contact area 3 and another contact area 53 that are arranged perpendicularly to the connecting lead 21 and the inverse-parallel connecting lead 71. The transistor with the lower surface area requirements is arranged in the circuit.

In an alternative embodiment, the connecting lead 21 comprises the first number N of conductive layers M1, M2, M3, M4. The first number N is designated in Equation 12 as $N_M$. Consequently, one method comprises the following steps: a first value of a surface area of a first transistor 33 is determined that has a first value of an on-resistance and a contact area 3 to which a number M of conductive layers are arranged in parallel and a number N-M of conductive layers are arranged perpendicularly. Another value of a surface area of at least one other transistor 33' is determined that has the first value of the on-resistance and the contact area 3 to which a number MM of conductive layers is arranged in parallel and a number N-MM of conductive layers is arranged perpendicularly. The number MM is here not equal to the number M. The transistor that has the smaller value of the surface area is selected from a set comprising the first and the one or more other transistors 33, 33', 33".

In this way, in one embodiment, the surface area of those transistors 33, 33', 33" that can be realized differently for the first number N of conductive layers can be determined. For the first number N of conductive layers, a number (N+1) of transistors 33, 33', 33" are different. Thus, with the above method, the value of the surface area can be defined such that the number M has the value 0 and the number MM runs through the values 1 to N.

In one alternative embodiment, in a method for designing a circuit, a value of a surface area of a transistor is specified, and, by means of the above equations, it is determined whether a first transistor 33 has a smaller on-resistance value than a second transistor 33'. The first transistor 33 has a contact area 3 and another contact area 53 that are arranged in parallel to the connecting lead 21 and the inverse-parallel connecting lead 71. The second transistor 33' comprises a contact area 3 and another contact area 53 that are arranged perpendicularly to the connecting lead 21 and the inverse-parallel connecting lead 71. The transistor with the lower on-resistance is arranged in the circuit.

In one alternative embodiment, the connecting lead 21 has a first number N of conductive layers M1, M2, M3, M4. Here, one method comprises the following steps: a first value of an on-resistance of a first transistor 33 is determined that has a first value of a surface area and a contact area 3 to which a number M of conductive layers is arranged in parallel and a number N-M of conductive layers is arranged perpendicularly. Another value of an on-resistance of at least one other transistor 33' is determined that has the first value of the surface area and the contact area 3 to which a number MM of conductive layers is arranged in parallel and a number N-MM of conductive layers is arranged perpendicularly. Here, the number MM is not equal to the number M. The transistor that has the smaller on-resistance value is realized from a set comprising the first and the one or more other transistors 33, 33', 33".

Here, in one embodiment, the value of the on-resistance can be determined from those distinguishable transistors 33, 33' that can be realized in the first number N of conductive layers. For the first number N of conductive layers, a number N+1 transistors 33, 33', 33" are different. Thus, the value of the on-resistance can be defined with the above method such that the number M has the value 0 and the number MM runs through the values 1 to N.

In the different methods, for the different, studied transistors, a pitch $P_M$ of the conductive layers that is arranged perpendicularly to the contact area 3 can be defined so that a minimum on-resistance or, alternatively, a minimum surface area of each transistor 33, 33', 33" is determined. The conductive layers that are arranged parallel to the contact area 3 have the pitch P.

For determining the surface area or the on-resistance, calculations are performed in which the equations specified in the description of FIGS. 6A-60 are used.

One result of the optimization can be, for example, that two conductive layers M1, M2 of the four conductive layers M1-M4 are arranged parallel to the contact area 3 and two other conductive layers M3, M4 of the four conductive layers are arranged perpendicularly to the contact area 3. Preferably, the conductive layers M1, M2 that are arranged closer to the contact area 3 are oriented parallel to the contact area 3 and the other conductive layers M3, M4 are oriented perpendicular to the contact area 3.

Figure 7A:
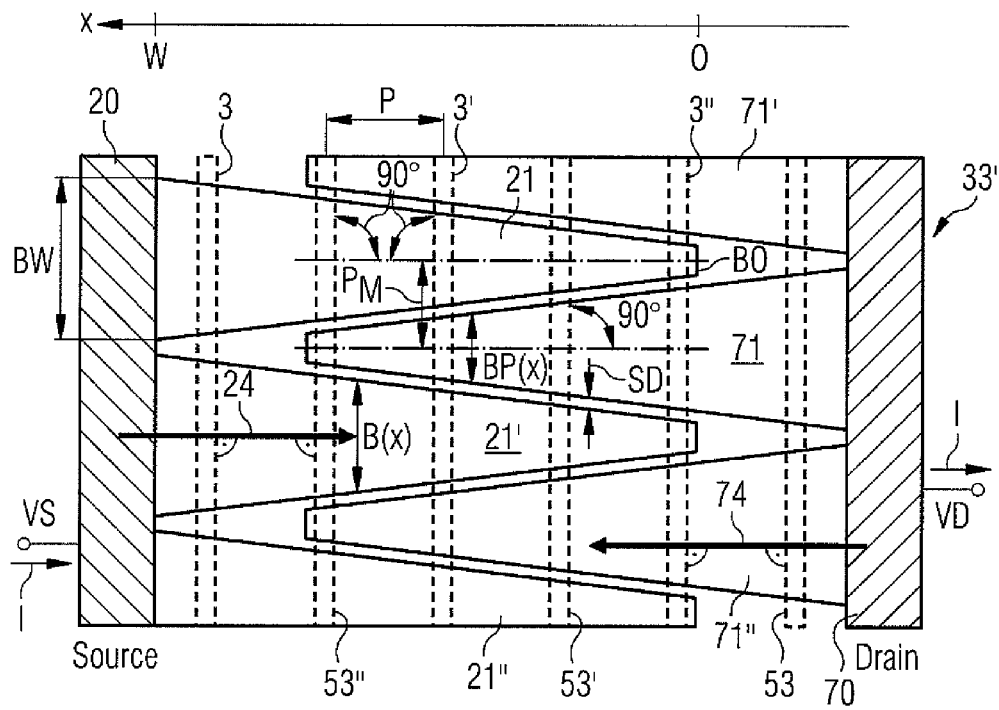
FIGS. 7A and 7B show additional transistors in top view with other example embodiments of connecting leads according to the invention.
Figure 7B:
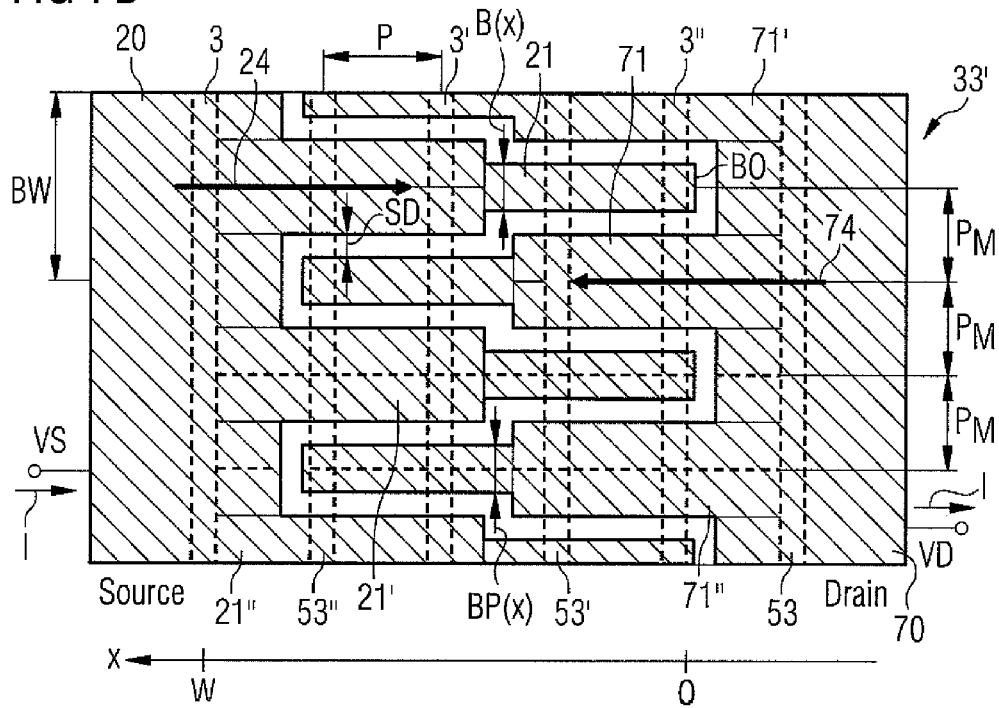

FIGS. 7A and 7B show example embodiments of transistors in a top view according to the invention. Analogous to FIG. 2A, the two field-effect transistors 33' have parallel contact areas 3, 3', 3" and parallel other contact areas 53, 53', 53". In contrast to FIG. 2A, the connecting leads 21, 21', 21" and the inverse-parallel connecting leads 71, 71', 71" are not arranged approximately parallel to the contact areas 3, 3', 3" and the other contact areas 53, 53', 53", but instead form an angle of 90° to the contact areas 3, 3', 3" and the other contact areas 53, 53', 53". The contact areas 3, 3', 3" are used for contacting semiconductor areas 2 not shown in FIG. 7A. Analogously, the other contact areas 53, 53', 53" are used for contacting other semiconductor areas 52 not shown in FIG. 7A. The connecting leads 21, 21', 21" have a main direction 24 that is perpendicular to the longer side of the rectangles of the contact areas 3, 3', 3" and to the longer side of the rectangles of the other contact areas 53, 53', 53". Likewise, the inverse-parallel connecting leads 51, 51', 51" have another main direction 74 that is perpendicular to the longer side of the rectangles of the contact areas 3, 3', 3" and to the longer side of the rectangles of the other contact areas 53, 53', 53". The main direction 24 and the other main direction 74 are parallel to each other. The spacing between the center of the contact area 3' and the center of the other contact area 53" is the pitch P. FIG. 7A shows an embodiment of the connecting leads 21, 21' with a width B(x) increasing linearly with increasing coordinate x and the inverse-parallel connecting leads 71, 71' with a width BP(x) decreasing linearly with increasing coordinate x. The strip conductor spacing SD is shown between the connecting lead 21' and the inverse-parallel connecting lead 71. Likewise, the pitch $P_M$ of the metallization is specified that can be calculated with the following equation:

$$P_M = SD + \frac{B(x) + BP(x)}{2} \quad (15)$$

where $P_M$ is the pitch of the metallization, SD is the spacing, B(x) is the width of the connecting leads 21, 21', and BP(x) is the width of the inverse-parallel connecting leads 71, 71'. In the construction according to FIG. 7A, the pitch $P_M$ is the spacing between the center of the connecting lead 21 and the center of the adjacent inverse-parallel connecting lead 71.

FIG. 7B shows another example embodiment of a transistor 33' with the connecting leads 21, 21', 21" and the inverse-parallel connecting leads 71, 71', 71" according to the invention. The change in the width B(x) of the connecting leads 21, 21', 21" and the width BP(x) of the inverse-parallel connecting leads 71, 71', 71" is realized according to FIG. 7B in discrete steps.

Thus, advantageously it is guaranteed that the conductivity S(x) of the connecting lead 21 is set lower in areas in which a high current flows through the cross section of the connecting lead 21 and is set higher in a wider area in which the current flow is low.

Advantageously, with the aid of this design, a uniform current distribution and a lower on-resistance Ron is achieved.

It is an advantage of the uniform current distribution that local overheating of the transistor 33' is avoided and thus the service life of the component is extended.

In one alternative embodiment, the connecting leads 21, 21', 21" according to FIG. 7A or 7B have the first number N of conductive layers M1, M2, M3, M4 that are arranged one above the other and that are electrically connected by means of vias 23, 73 conductively to each other and to the contact areas 3, 3', 3". Accordingly, the inverse-parallel connecting leads 71, 71', 71" comprise the first number N of conductive layers M1, M2, M3, M4.

In another alternative embodiment, connecting leads like those shown in FIG. 2A as examples are arranged between the contact areas 3, 3', 3" and the connecting leads 21, 21', 21" according to FIG. 7A or 7B and connect in an electrically conductive way the contact areas 3, 3', 3" to the connecting leads 21, 21', 21" shown in FIG. 7A or 7B. Accordingly, inverse-parallel connecting leads like those shown in FIG. 2A as examples are arranged between the other contact areas 53, 53', 53" and the inverse-parallel connecting leads 71, 71', 71" according to FIGS. 7A and 7B. The connecting leads according to FIG. 2A and the connecting leads according to FIG. 7A or 7B can each have one or more conductive layers M1, M2, M3, M4. Thus, a transistor comprises connecting leads that are oriented parallel to the semiconductor area 2, 2', 2" and connecting leads that are oriented perpendicular to the semiconductor area 2', 2", 2'". Such embodiments are explained in greater detail in FIGS. 9A-9D.

Figure 8A:
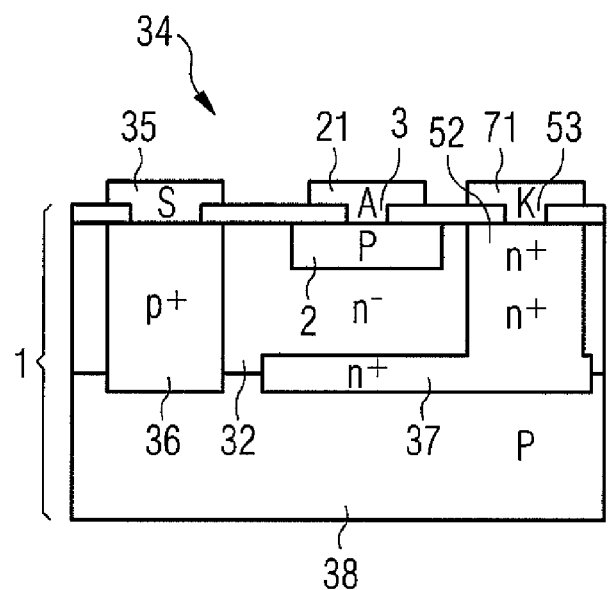
FIGS. 8A and 8B show an example embodiment of a diode with connecting leads in top view and as a cross section according to the invention.
Figure 8B:
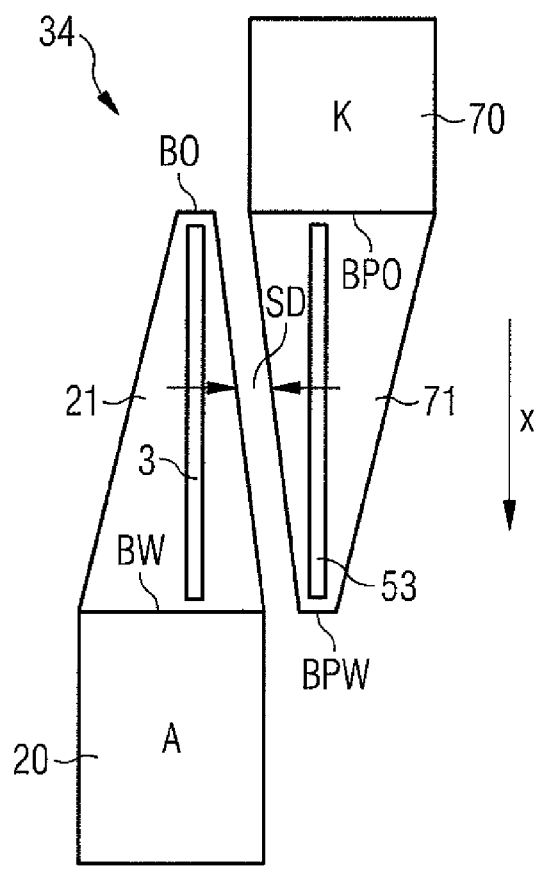

FIGS. 8A and 8B show an example embodiment of a diode according to the invention as a cross section and in a top view.

FIG. 8A shows the diode 34 in cross section. The semiconductor body 1 comprises a carrier 38 above which a buried layer 37 is arranged. The substrate 32 in which the semiconductor area 2 is arranged is deposited above the buried layer 37. The diode 34 comprises the connecting lead 21 that contacts, in the contact area 3, the semiconductor area 2 constructed as an anode. The diode 34 further comprises the inverse-parallel connecting lead 71 that contacts, in the other contact area 53, the other semiconductor area 52 provided as a cathode. The other semiconductor area 52 is conductively connected to the buried layer 37. The carrier 38 is contacted by means of a terminal 35 and an area 36. From the connecting lead 21 flows a diode current through the semiconductor area 2 into the substrate 32 and from there via the buried layer 37 and the other semiconductor area 52 to the inverse-parallel connecting lead 71.

FIG. 8B shows the diode 34 in a top view. The diode 34 comprises the supply line 20 that transitions into the connecting lead 21 and the other supply line 70 that transitions into the inverse-parallel connecting lead 71. Advantageously, with the aid of this dimensioning of the connecting leads 21, 71, a uniform current distribution and a low series resistance of the diode 34 are achieved.

Figure 9A:
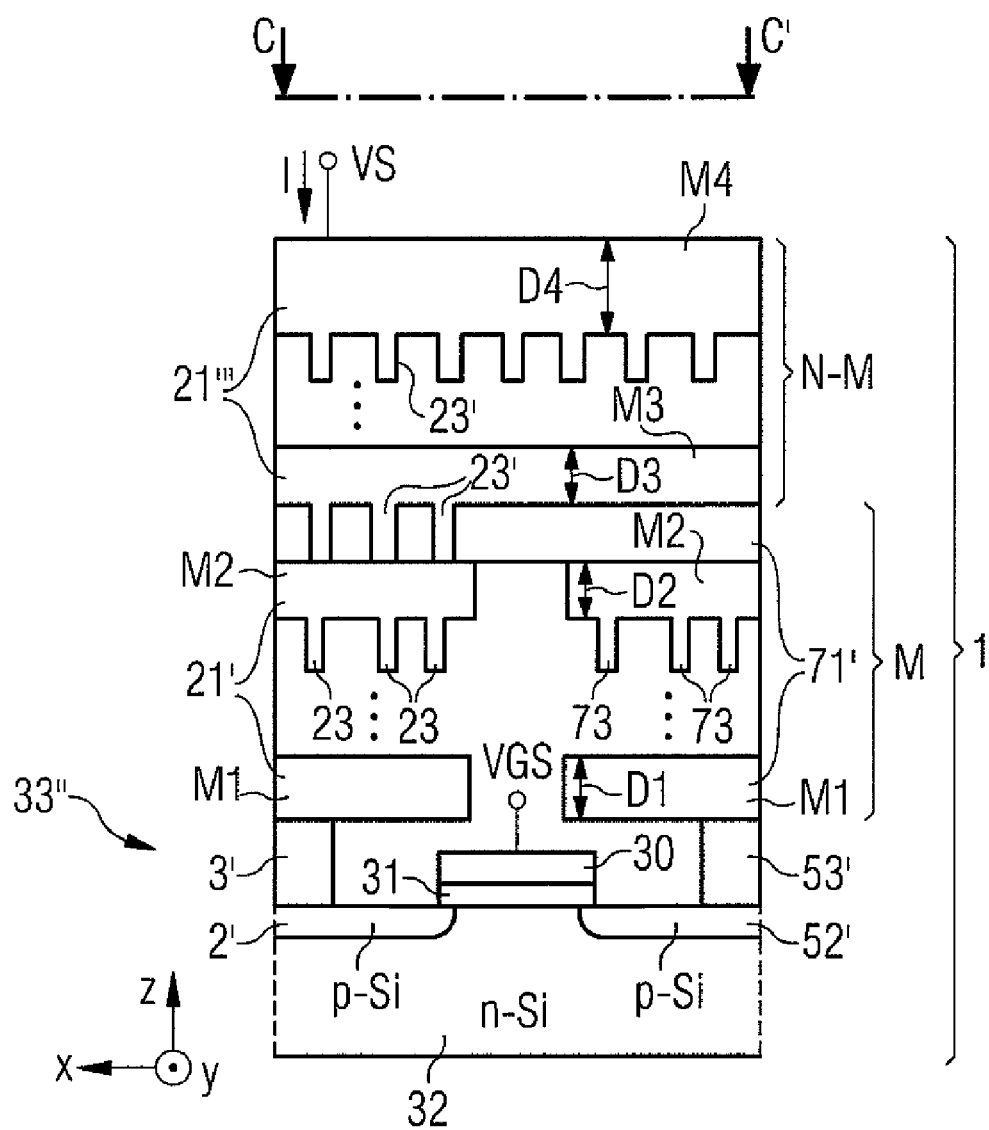

FIG. 9A shows an example embodiment of a semiconductor body with a transistor according to the invention in cross section. The embodiment shown in FIG. 9A is a refinement of the transistor shown in FIG. 2B. The semiconductor body 1 has the substrate 32 in which the semiconductor area 2' and the other semiconductor area 52' are diffused. The transistor 33" thus comprises the semiconductor area 2' and also the other semiconductor area 52'. Furthermore, the transistor 33" has the gate isolator 31 and the gate electrode 30. The gate electrode 30 is arranged on the gate isolator 31 that is arranged, in turn, on the substrate 32. The transistor 33" comprises the first number N of conductive layers M1, M2, M3, M4. The transistor 33" has the connecting lead 21' that comprises the second number M of conductive layers M1, M2 that are also called lower conductive layers. The second number M of conductive layers M1, M2 of the connecting lead 21' is arranged in parallel to each other and in parallel to the semiconductor area 2'. The first conductive layer M1 of the connecting lead 21' is connected via the contact area 3' to the semiconductor area 2'. The second conductive layer M2 of the connecting lead 21' is conductively connected by means of vias 23 to the first conductive layer M1 of the connecting lead 21'. With the points between the first and the second conductive layer M1, M2 it is indicated that the second number M can be greater than two. Alternatively, the second number M can also have the value one.

Accordingly, the inverse-parallel connecting lead 71' comprises the second number M of conductive layers M1, M2 arranged parallel to each other and to the other semiconductor area 52'. The first conductive layer M1 of the inverse-parallel connecting lead 71' is connected to the other semiconductor area 52' via the other contact area 53'. Accordingly, the second conductive layer M2 of the inverse-parallel connecting lead 71' is electrically conductively connected by means of other vias 73 to the first conductive layer M1 of the inverse-parallel connecting lead 71'.

Furthermore, the transistor 33" comprises a number N-M of conductive layers M3, M4 that are also called upper conductive layers. The connecting lead 21'" is shown in the example cross section according to FIG. 9A. The third conductive layer M3 of the connecting lead 21'" is connected by means of vias 23' to the second conductive layer M2 of the connecting lead 21'. Furthermore, the fourth conductive layer M4 of the connecting lead 21'" is electrically conductively connected by means of vias 23' to the third conductive layer M3 of the connecting lead 21'". In the embodiment shown in FIG. 9A, the first number N has the value four, the second number M has the value two, and consequently, the number N-M also has the value two. With the points between the third and the fourth conductive layers M3, M4 it is indicated that the number N-M can also be greater than two. Alternatively, the number N-M can also have the value one. The first conductive layer M1 has the first thickness D1. Accordingly, the second, the third, and the fourth conductive layers M2, M3, M4 have the second, a third, and a fourth thickness D2, D3, D4. The four thicknesses D1, D2, D3, D4 can have the same value.

In one alternative embodiment, the fourth thickness D4 can have a greater value than the first, the second, and the third thickness D1, D2, D3. Thus, advantageously the thickness D4 of the uppermost conductive layer M4 can be greater than the thicknesses D1, D2, D3 of the underlying conductive layers M1, M2, M3.

Figure 9B:
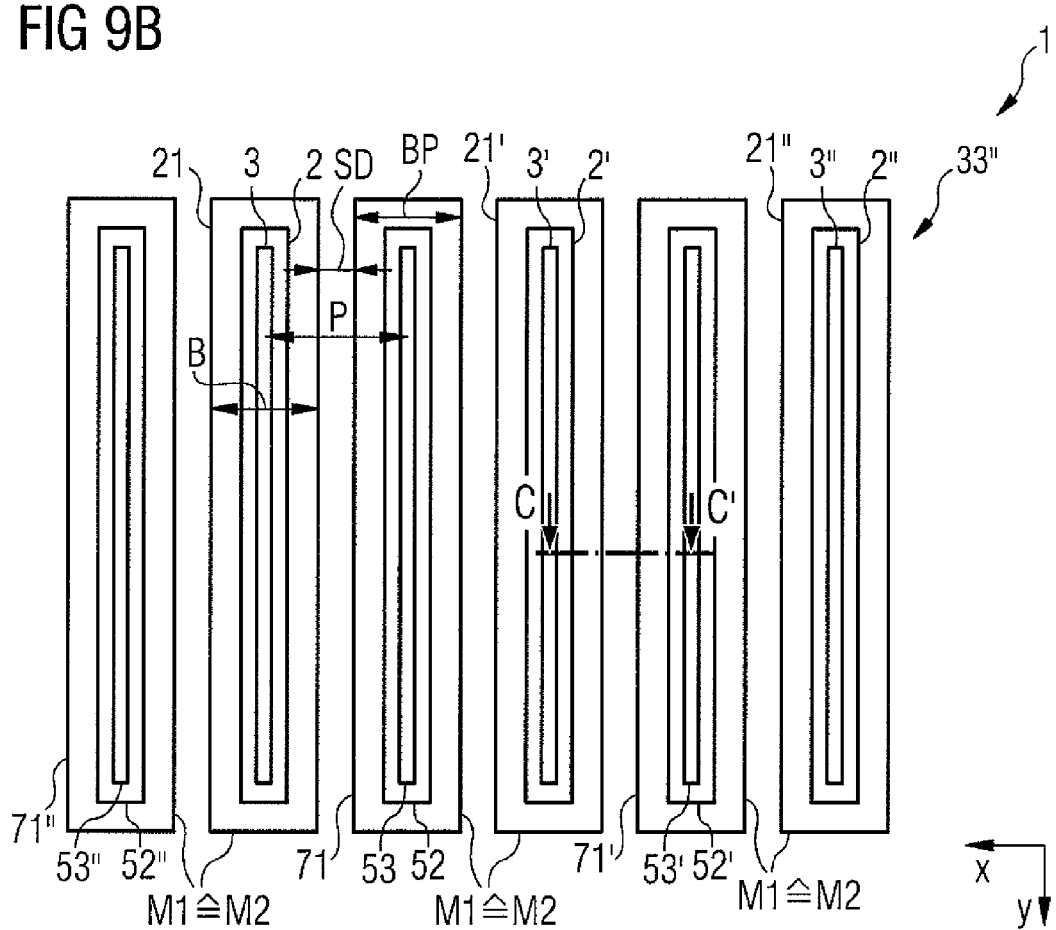

FIG. 9B shows an example embodiment of the semiconductor body with the transistor according to the invention in a top view of the first conductive layer M1 shown in FIG. 9A, and thus of one of the lower conductive layers. FIG. 9A shows the cross section of the transistor 33" along the line CC' indicated in FIG. 9B. According to FIG. 9B the transistor comprises a third number N3 of semiconductor areas 2, 2', 2" and also a fourth number N4 of other semiconductor areas 52, 52', 52". The third and the fourth number N3, N4 each have, according to FIG. 9B, the value 3. In addition, the transistor 33" comprises the third number N3 of contact areas 3, 3', 3" and also the fourth number N4 of other contact areas 53, 53', 53". Furthermore, the transistor 33" comprises the third number N3 of connecting leads 21, 21', 21" of the first conductive layer M1 and also the fourth number N4 of inverse-parallel connecting leads 71, 71', 71" of the first conductive layer M1. The semiconductor areas 2, 2', 2", the other semiconductor areas 52, 52', 52", the connecting leads 21, 21', 21", the inverse-parallel connecting leads 71, 71', 71", the contact areas 3, 3', 3" and the other contact areas 53, 53', 53" are each constructed as rectangles. The connecting leads 21, 21' have the width B and the inverse-parallel connecting leads 71, 71' have the width BP. The spacing SD is between the connecting lead 21 and the inverse-parallel connecting lead 71. Each of the longer sides of the rectangles are arranged parallel to each other. The connecting lead 21' is electrically conductively connected, as already shown in FIG. 9A, by means of the contact area 3' to the semiconductor area 2'. Likewise, the inverse-parallel connecting lead 71' is connected by means of the other contact area 53' to the other semiconductor area 52'. One area of the transistor 33" can be constructed as a rectangle that comprises the connecting leads 21, 21', 21" and the inverse-parallel connecting leads 71, 71', 71".

The connecting leads 21, 21', 21" and the inverse-parallel connecting leads 71, 71', 71" of the second conductive layer M2 are constructed in the top view like the connecting leads 21, 21', 21" and the inverse-parallel connecting leads 71, 71', 71" of the first conductive layer M1.

FIG. 9C shows an example embodiment of the semiconductor body with the transistor according to the invention in top view of the third conductive layer M3 shown in FIG. 9A and thus of one of the upper conductive layers. In FIG. 9C the second conductive layer M2 already shown in FIG. 9B is shown. The third conductive layer M3 has an interdigitated structure. The third conductive layer M3 of the connecting lead 21'", 21" comprises the first plural number N1 of fingers of the interdigitated structure. Accordingly, the third conductive layer M3 of the inverse-parallel connecting lead 71'", 71"" comprises the second plural number N2 of fingers. According to FIG. 9C, the first and the second plural numbers N1, N2 are each two. A main direction 24 of the third conductive layer M3 of the connecting lead 21'" is parallel to a main direction of the third conductive layer M3 of the connecting lead 21"". Accordingly, another main direction 74 of the third conductive layer M3 of the inverse-parallel connecting lead 71'" is parallel to a main direction of the third conductive layer M3 of the inverse-parallel connecting lead 71"". The main direction 24 is approximately parallel to the other main direction 74. The main directions 24, 74 are approximately orthogonal to the longer side of the rectangle of the semiconductor areas 2, 2', 2" and the other semiconductor areas 52, 52', 52". The main directions 24, 74 are thus approximately orthogonal to the side with the larger length of the rectangles of the first and the second conductive layer M1, M2 of the connecting leads 21, 21', 21" and also the inverse-parallel connecting leads 71, 71', 71".

The third conductive layer M3 of the connecting leads 21, 21', 21" has a width B"(x) that changes linearly as a function of a coordinate X. Accordingly, the width BP"(x) of the third conductive layer M3 of the inverse-parallel connecting leads 71'", 71"" also changes linearly with the coordinate X. Here, the width B"(x) of the connecting lead 21'" and the width BP"(x) of the inverse-parallel connecting lead 71'" have the following relationship:

$$P_M = \frac{B''(x) + BP''(x)}{2} + SD'',$$

where $P_M$ is the pitch of the third conductive layer M3 and SD" is the spacing of the third conductive layer M3. Vias 23' connect the second conductive layer M2 of the connecting leads 21, 21', 21" to the third conductive layer M3 of the connecting lead 21'", 21"". Likewise, other vias 73' connect the second conductive layer M2 of the inverse-parallel connecting leads 71, 71', 71" to the third conductive layer M3 of the inverse-parallel connecting lead 71'", 71"".

The current I thus flows from the supply line 20 via the fourth and the third conductive layer M3, M4 of the connecting leads 21'", 21"" into the second and the first conductive layer M1, M2 of the connecting leads 21, 21', 21" and from these layers into the semiconductor areas 2, 2', 2". From the semiconductor areas 2, 2', 2" the current I flows through a channel at the interface area between the substrate 32 and the gate isolator 31 into the other semiconductor areas 52, 52', 52". From the other semiconductor areas 52, 52', 52" the current I flows via the first and the second conductive layer M1, M2 of the inverse-parallel connecting leads 71, 71', 71" into the third and the fourth conductive layer M3, M4 of the inverse-parallel connecting leads 71'", 71"" and from these into the other supply line 70.

Advantageously, by means of the narrowing connecting leads 21''', 21'''' or narrowing inverse-parallel connecting leads 71''', 71'''', it is achieved that a current density in the connecting leads or the inverse-parallel connecting leads is approximately constant. Thus, advantageously, a smallest possible on-resistance of the transistor 33" is realized.

The third number N3 can be equal to the first plural number N1. As shown in FIG. 9C, the third number N3 is not equal to the first plural number N1. Accordingly, the fourth number N4 can be equal to or not equal to the second plural number N2.

In one embodiment, the fourth conductive layer M4 in the top view shown in FIG. 9C can be constructed like the third conductive layer M3. In an alternative, not-shown embodiment, the fourth conductive layer M4 can have a spacing SD''' between the connecting lead 21''' and the inverse-parallel connecting lead 71''' that is greater than the spacing SD'' of the third conductive layer M3. Therefore, the fourth conductive layer M4 can also be structured for a high value for the fourth thickness D4 with high yield.

Figure 9D:
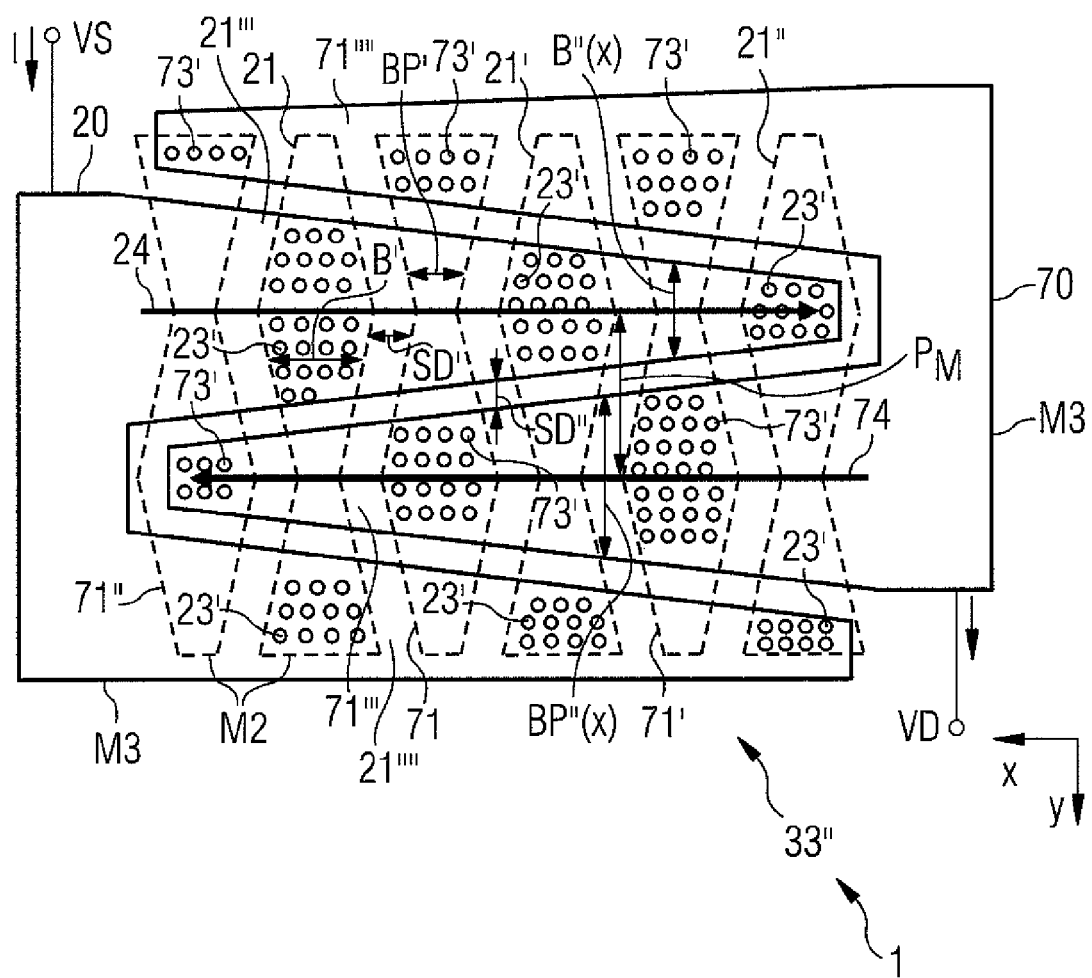

FIG. 9D shows an alternative, example embodiment of a semiconductor body with a transistor according to the invention. The embodiment shown in FIG. 9D is a refinement of the transistor 33" shown in FIG. 9C. The third conductive layer M3 of the connecting leads 21''', 21'''' is constructed approximately as shown in FIG. 9C. In contrast to FIG. 9C, in the top view according to FIG. 9D, the second conductive layer M2 of the connecting leads 21, 21', 21" has a greater width B' in a region in which it is arranged under the third layer M3 of the connecting leads 21''', 21'''' compared with a width B' in a region in which it is arranged under the third layer M3 of the inverse-parallel connecting lead 71''', 71''''. The second conductive layer M2 of the connecting leads 21, 21', 21" thus no longer has a rectangular construction, but instead is realized with a wedge shape. The second conductive layer M2 of the inverse-parallel connecting leads 71, 71', 71" can also be realized with a wedge shape.

Thus, advantageously in the second conductive layer M2 the width B' of the connecting lead 21, 21', 21''' increases at the position at which a very high current flows. Thus, advantageously the on-resistance can be further reduced.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor body comprising:
   a connecting lead for contacting a semiconductor area;
   wherein conductivity S per unit length of the connecting lead changes approximately linearly from a first value SW to a second value S0;
   wherein the connecting lead comprises N conductive layers that are connected to each other by vias, the N conductive layers forming a parallel circuit and including main directions that are parallel to each other, and N is greater than 1;
   wherein a width B of one of the conductive layers from among said N conductive layers includes a first function depending on a location x along a length of the connecting lead and a width if of another of the conductive layers from among said N conductive layers includes a second function depending on the location x along the length of the connecting lead; and
   wherein the first function is different from the second function.

2. The semiconductor body according to claim 1, wherein the semiconductor area is electrically conductively connected to the connecting lead.

3. The semiconductor body according to claim 1, wherein the width B of the connecting lead changes from a first value BW to a second value B0.

4. The semiconductor body according to claim 3, wherein the second value B0 corresponds to a specified, minimum strip conductor width Bmin.

5. The semiconductor body according to claim 1, wherein a first conductive layer from among said N conductive layers comprises the width B that is different from the width B' of a second conductive layer from among said N conductive layers.

6. The semiconductor body according to claim 1, wherein at least one of the conductive layers from among said N conductive layers has a second value B0=0 at an end of the connecting lead.

7. The semiconductor body according to claim 1, wherein one of the conductive layers from among said N conductive layers has a first thickness and another of the conductive layers from among said N conductive layers has another thickness that has a greater value than the first thickness.

8. The semiconductor body according to claim 1, further comprising:
   a further connecting lead for contacting another semiconductor area that is arranged approximately parallel to the connecting lead;
   wherein the conductivity S per unit length of the further connecting lead increases from a first value SPW to a second value SP0 and the conductivity S per unit length of the connecting lead decreases from the first value SW to the second value S0; and
   wherein current flows from the connecting lead via the semiconductor area, a substrate of the semiconductor body and the other semiconductor area to the further connecting lead.

9. The semiconductor body according to claim 8, wherein the further connecting lead comprises a width BP that increases from a first value BPW to a second value BP0 and the connecting lead comprises the width B that decreases from a first value BW to a second value B0, such that a sum from the width B of the connecting lead and the width BP of the inverse-parallel connecting lead is approximately constant.

10. A transistor comprising a semiconductor body according to claim 8, wherein the transistor comprises:
    the semiconductor area that is electrically contacted to the connecting lead; and
    the additional semiconductor area that is electrically contacted to the further connecting lead.

11. The transistor according to claim 10, wherein the transistor is a field-effect transistor, the semiconductor area is constructed as a source area and the other semiconductor area is constructed as a drain area, and the transistor comprises:
    a supply line that is connected to a first plural number N1 of fingers that each comprise a connecting lead;
    another supply line that is connected to a second plural number N2 of fingers that each comprise the further connecting lead;
    a gate isolator that is applied on the semiconductor body; and
    a gate electrode that is applied on the gate isolator.

12. A diode comprising a semiconductor body according to claim 1, wherein the diode comprises the semiconductor area that is connected to the connecting lead for its electrical contact.

13. A method for designing a semiconductor body with a connecting lead, comprising the steps of:
- dimensioning, by a processor of a computer, a connecting lead to contact a semiconductor area in a semiconductor body such that the connecting lead includes a length W, a conductivity S per unit length of the connecting lead changing approximately linearly from a first value SW to a second value S0; and
- forming, by the processor of the computer, the N conductive layers into a parallel circuit including main directions that are parallel to each other, the connecting lead comprising N conductive layers that are connected to each other by vertical vias, and N being greater than 1;
- wherein a width B of one of the conductive layers from among said N conductive layers includes a first function depending on a location x along a length of the connecting lead and a width B' of another of the conductive layers from among said N conductive layers includes a second function depending on the location x along the length of the connecting lead; and
- wherein the first function is different from the second function.

14. The method according to claim 13, wherein the connecting lead comprises N conductive layers, and wherein the method further comprises the steps of:
- calculating, by the processor, a minimum surface area of a first transistor for a value of an on-resistance of the first transistor that has a contact area to which a number M of conductive layers are arranged in parallel to the contact area and a number N-M of conductive layers are arranged perpendicularly to the contact area;
- calculating, by the processor, a minimum surface area of at least one other transistor for the value of the on-resistance, the other transistor including the contact area to which a number MM of conductive layers are arranged in parallel to the contact area and a number N-MM of conductive layers are arranged perpendicularly to the contact area, the number MM not being equal to the number M; and
- selecting the transistor that has the smaller minimum surface area from a set comprising the first and the other transistors;
- wherein the first transistor and the at least one other transistor each comprise a further connecting lead and the minimum surface area of the first transistor is constructed as a rectangle that comprises the connecting lead and the further connecting lead of the first transistor, and the area of the at least one other transistor is constructed as a rectangle that comprises the connecting lead and the further connecting lead of the at least one other transistor.

15. The method according to claim 14, wherein the minimum surface area of a number N+1 transistors is defined such that the number M has the value 0 and the number MM runs through the values 1 to N.

16. The method according to claim 14, wherein a pitch $P_M$ of the conductive layers that are arranged perpendicularly to the contact area is defined such that the surface area of each transistor is minimal.

17. The method according to claim 13, wherein the connecting lead comprises N conductive layers, and wherein the method further comprises the steps of:
- calculating, by the processor, a first value of an on-resistance of a first transistor that has a first value of a surface area and a contact area to which a number M of conductive layers are arranged in parallel to the contact area and a number N-M of conductive layers are arranged perpendicularly to the contact area;
- calculating, by the processor, another value of an on-resistance of the at least one additional transistor that has the first value of the surface area and a contact area to which a number MM of conductive layers are arranged in parallel to the contact area and a number N-MM of conductive layers are arranged perpendicularly to the contact area, wherein the number MM not being equal to the number M; and
- selecting the transistor that has the smaller value of the on-resistance from a set comprising the first and the at least one additional transistor;
- wherein the first transistor and the at least one other transistor each comprise a further connecting lead and the minimum surface area of the first transistor is constructed as a rectangle that comprises the connecting lead and the further connecting lead of the first transistor, and the area of the at least one other transistor is constructed as a rectangle that comprises the connecting lead and the further connecting lead of the at least one other transistor.

18. The method according to claim 17, wherein the value of the on-resistance of a number N+1 transistors is defined such that the number M has the value 0 and the number MM runs through the values 1 to N.

19. The method according to claim 17, wherein a pitch $P_M$ of the conductive layers arranged perpendicularly to the contact area or a pitch P of the conductive layers arranged parallel to the contact area is defined such that the on-resistance of each transistor is minimal.

20. A non-transitory computer program product encoded with a computer program executed by a computer for designing a semiconductor body with a connecting lead, the computer program comprising:
- program code instructions for dimensioning a connecting lead to contact a semiconductor area in a semiconductor body such that the connecting lead includes a length W, a conductivity S per unit length of the connecting lead changing approximately linearly from a first value SW to a second value S0; and
- program code instructions for forming the N conductive layers into a parallel circuit including main directions that are parallel to each other, the connecting lead comprising N conductive layers that are connected to each other by vertical vias, and N being greater than 1;
- wherein a width B of one of the conductive layers from among said N conductive layers includes a first function depending on a location x along a length of the connecting lead and a width B' of another of the conductive layers from among said N conductive layers includes a second function depending on the location x along the length of the connecting lead; and
- wherein the first function is different from the second function.

* * * * *

UNITED STATES PATENT AND TRADEMARK OFFICE
CERTIFICATE OF CORRECTION

PATENT NO.        : 8,399,937 B2                                    Page 1 of 1
APPLICATION NO.   : 12/447185
DATED             : March 19, 2013
INVENTOR(S)       : Georg Röhrer et al.

It is certified that error appears in the above-identified patent and that said Letters Patent is hereby corrected as shown below:

In the Claims

Col. 23, line 62, in claim 1, line 14, change "if" to -- B' --.

Signed and Sealed this
Tenth Day of December, 2013

Margaret A. Focarino
*Commissioner for Patents of the United States Patent and Trademark Office*